United States Patent
Natsuhara et al.

(10) Patent No.: US 7,045,045 B2
(45) Date of Patent: May 16, 2006

(54) WORKPIECE HOLDER FOR PROCESSING APPARATUS, AND PROCESSING APPARATUS USING THE SAME

(75) Inventors: Masuhiro Natsuhara, Hyogo (JP); Hirohiko Nakata, Hyogo (JP); Akira Kuibira, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 465 days.

(21) Appl. No.: 10/237,975

(22) Filed: Sep. 10, 2002

(65) Prior Publication Data

US 2003/0089600 A1  May 15, 2003

(30) Foreign Application Priority Data

Sep. 11, 2001 (JP) .............................. 2001-275236
Apr. 15, 2002 (JP) .............................. 2002-112523

(51) Int. Cl.
*C25B 9/02* (2006.01)

(52) U.S. Cl. ........................ 204/297.06; 204/297.01; 204/297.06; 204/286.1; 204/287; 361/234; 118/728; 118/729; 118/730

(58) Field of Classification Search ........... 204/297.01, 204/297.02, 297.06, 286.1, 287; 361/234; 118/728, 729, 730
See application file for complete search history.

(56) References Cited

U.S. PATENT DOCUMENTS 6,215,643 B1 * 4/2001 Nagasaki ..................... 361/234
6,669,783 B1 * 12/2003 Sexton et al. ............... 118/728
6,730,175 B1 * 5/2004 Yudovsky et al. .......... 118/728

FOREIGN PATENT DOCUMENTS

| JP | 6-28258 | 4/1994 |
| JP | 7-153706 | 6/1995 |
| JP | 2525974 | 5/1996 |
| JP | 2001-230059 A | 8/2001 |
| JP | 2001-237051 A | 8/2001 |

* cited by examiner

Primary Examiner—Bruce F. Bell
(74) Attorney, Agent, or Firm—McDermott Will & Emery LLP

(57) ABSTRACT

An inexpensive workpiece holder having high reliability and a processing apparatus equipped with the workpiece holder are provided, in which damage caused by oxygen in the air is prevented. The holder comprises: a ceramic body which has an electrode and a heater circuit and which can holds a workpiece; a tubular member having an end portion connected to the ceramic body; a sealing member which is disposed inside the tubular member and which isolates a space inside the tubular member into two regions: a region on the first end portion ("sealed portion") and a region on the opposite side ("opposite region"); and power supply conductive members which extend from the opposite region side, penetrating the sealing member to the sealed region side, and which are electrically connected to the electrode and the heater circuit.

38 Claims, 14 Drawing Sheets

WORKPIECE HOLDER FOR PROCESSING APPARATUS, AND PROCESSING APPARATUS USING THE SAME

BACKGROUND OF THE INVENTION

1. Field of the Invention

The present invention relates to a holder for retaining a material, such as a wafer, to be processed (hereinafter referred to as "workpiece holder" or a "susceptor"), in a processing apparatus such as a semiconductor manufacturing apparatuses, and a processing apparatus using the same. In particular, the present invention relates to a workpiece holder having superior reliability against heat cycle, and to a processing apparatus having such workpiece holder.

2. Description of the Related Art

Heretofore, in manufacturing steps of semiconductor devices, film-formation or etching treatment have been performed on workpiece, that is, semiconductor substrates. A processing apparatus for processing such substrates is provided with a susceptor, which is a holder for retaining a semiconductor substrate during its treatment.

A conventional susceptor described above has been disclosed in, for example, Japanese Unexamined Patent Application Publication No. 7-153706.

However, the conventional susceptor described above has such problems as described below. That is, in order to supply an inert gas inside a supporting table, a gas supply tube must be provided for the susceptor, and in addition, devices necessary for supplying an inert gas, such as mass flow controller, must be connected to the gas supply tube. Consequently, the structure of the susceptor becomes complicated, and as a result, manufacturing cost of the susceptor used as a workpiece holder is increased.

In addition, when this susceptor is used, running cost of the susceptor is also increased since an inert gas must always be supplied inside the supporting table.

SUMMARY OF THE INVENTION

An object of the present invention is to provide an inexpensive workpiece holder of high reliability that can be obtained by avoiding damage caused by reacting gases, and a processing apparatus provided with such a workpiece holder.

A workpiece holder of the present invention comprises: a ceramic body which has an electrical circuit and which can hold a workpiece; a tubular member having an end portion ("first end portion") fixed to the rear surface of the ceramic body; a sealing member which is disposed inside the tubular member and bonded thereto and which separates a space inside the tubular member into two regions: a region on the first end portion side ("sealed region") and a region on the opposite side ("opposite region"); and power supply conductive members which extends from the opposite region side, penetrating the sealing member to the sealed region side, and which are electrically connected to the electrical circuit of the ceramic body.

A processing apparatus of the present invention is equipped with the above-mentioned workpiece holder.

Susceptors used in semiconductor manufacturing apparatuses are required to withstand severe process conditions, such as etching treatment on semiconductor substrates, and in addition, the susceptors have been required to be inexpensive. When the workpiece holder of the present invention is used, an inexpensive susceptor that can reliably withstand severe process conditions can be obtained for use in a semiconductor manufacturing apparatus.

In the workpiece holder according to the present invention, since the sealing member is disposed inside the tubular member supporting the ceramic body and is bonded thereto, connection portions at which the electrical circuits for the ceramic body are connected to the power supply conductive member can be isolated from an atmosphere around the workpiece holder. Hence, when the workpiece holder of the present invention is used for processing workpieces such as substrates, the connection portions can be prevented from being damaged by oxygen contained in the air present inside the tubular member. Therefore, it is unnecessary to supply an inert gas into the space inside the tubular member in order to avoid such damage of the connection portions as described above. This results in reduction in cost of the workpiece holder.

DESCRIPTION OF THE PREFERRED EMBODIMENTS

Figure 1:
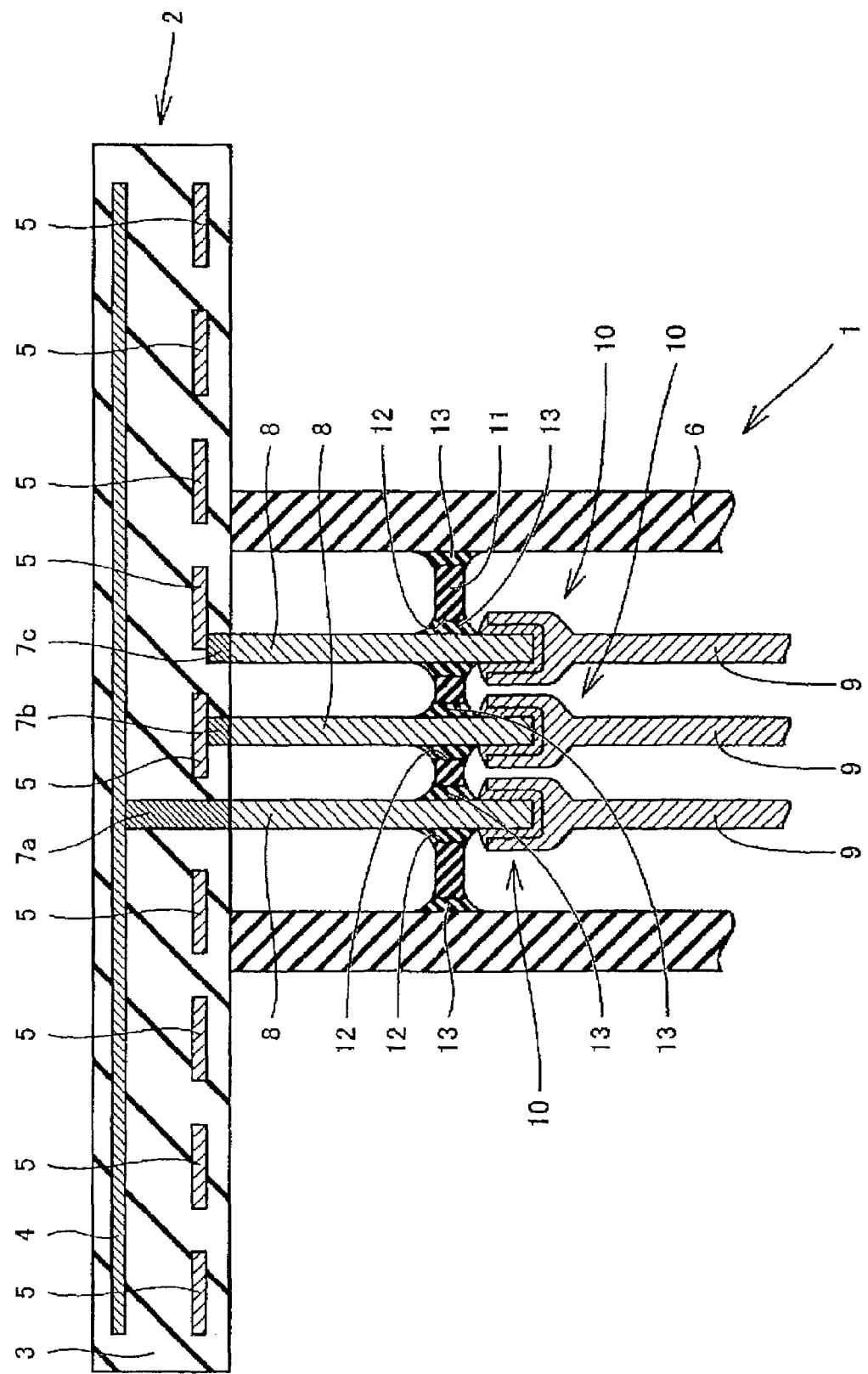
FIG. 1 is a schematic, cross-sectional view of a workpiece holder, which is used in a processing apparatus, according to a first embodiment of the present invention.

A workpiece holder in accordance with a first aspect of the present invention comprises: a ceramic body which has an electrical circuit and which is used for holding workpiece: a tubular member having an end portion ("first end portion") bonded to the ceramic body; a sealing member which is disposed inside the tubular member and bonded thereto and which separates a space inside the tubular member into two regions: a region on the first end portion side ("sealed region"); and a region on the opposite side ("opposite region"); and power supply conductive members which extends from the opposite region side to the sealed region side, penetrating the sealing member, and which are electrically connected to the electrical circuit.

The electrical circuit in the ceramic body includes, for example, a heater circuit for heating a workpiece, an electrostatic electrode for retaining the workpieces on the ceramic body, or an RF electrode for generating plasma. The material for forming this electrical circuit may be low oxidation-resistance tungsten or molybdenum, etc. In addition, a material having low oxidation-resistance is also used in some cases for a power supply terminal used at the connection portion between the electrical circuit and the power supply conductive member. Accordingly, if the connection portion between the power supply conductive member and the electrical circuit or the power supply terminal is in the air, the electrical circuit exposed in the tubular member may be corroded by oxygen which is present in the air in the case in which the workpiece holder is heated and semiconductor substrates or the like are placed thereon and etched.

However, according to the present invention, the connection portions between the electrical circuit for the ceramic body and the power supply conductive members are located in a region surrounded by the sealing member, the tubular member, and the ceramic body (that is, the sealed region mentioned above). If a bonding region between the tubular member and the ceramic body and a bonding portion between the sealing member and the ceramic body are formed so as to have predetermined airtightness, the portion (sealed portion) in which the connection portions described above are located is isolated from a apace surrounding the sealed portion inside the tubular member (hereinafter, the "surrounding region"). Consequently, when a heating treatment such as etching is performed, it is possible to prevent the electrical circuit or a material forming the connection portion from being corroded by oxygen present in the atmosphere inside the tubular member.

In addition, since the sealing member is disposed inside the tubular member such that the sealed region is isolated thereby from the surrounding region as described above, it is unnecessary to provide plumbing for supplying an inert gas into the tubular member as has been done in a conventional apparatus. Accordingly, the structure of a workpiece holder can be simplified, and hence the manufacturing cost thereof can be reduced. In addition, when a workpiece is processed (by etching or the like) using the workpiece holder, it is not necessary to continuously supply an inert gas inside the tubular member, and hence, the running cost of treatment using the workpiece holder described above can be reduced.

Furthermore, by selecting materials having suitable thermal expansion coefficients, which are not so different from each other, for the ceramic body, the tubular member, the sealing member, and the power supply conductive members, which constitute the workpiece holder, it is possible to avoid a problem such as local concentration of thermal stress due to change in the atmospheric temperature. Accordingly, a workpiece holder having high reliability against thermal hysteresis due to heat cycle can be obtained.

In the workpiece holder in accordance with the first aspect of the present invention, the sealing member is preferably provided in contact with the rear surface (opposite side of a surface on which a wafer is to be mounted) of the ceramic body. In addition, in the workpiece holder in accordance with the first aspect of the present invention, the sealing member may be bonded to the surface of the ceramic body with a fixing bond member provided therebetween.

In such case, the sealing member itself need not have a large strength, since the ceramic body can support the sealing member. Accordingly, the thickness of the sealing member can be decreased. Hence, the degree of freedom of designing the sealing member can be made larger.

In the workpiece holder in accordance with the first aspect of the present invention, the fixing bond member may be formed by heating a fixing bond material at a pressure of 100 $g/cm^2$ or more applied thereto through the sealing member Accordingly, the number of minute gaps can be reduced in the fixing bond member, and hence a bonding portion having a superior airtightness can be obtained. In addition, the bond strength between the ceramic body and the sealing member can be simultaneously increased. The reason the pressure applied to the fixing bond member is set to 100 $g/cm^2$ or more is that when the pressure is 100 $g/cm^2$ or more, the airtight property of the fixing bond member can be increased, and when the pressure is less than 100 $g/cm^2$, the advantage of increase in airtight property cannot be obtained.

In the workpiece holder in accordance with the first aspect of the present invention, the sealing member may be disposed at a distance from the surface of the ceramic body.

In this case, since the sealing member is not in contact with the ceramic body, it is possible to prevent the temperature distribution of the ceramic body. Accordingly, due to the contact of the sealing member with the ceramic body from becoming uneven due to the contact with the sealing member. As a result, the temperature distribution in the ceramic body can be made more uniform, and hence the temperature distribution in a workpiece held on the ceramic body can be easily made uniform.

In the workpiece holder in accordance with the first aspect of the present invention, the region surrounded by the sealing member, the tubular member, and the ceramic body may be vacuum or non-oxidizing atmosphere.

In this case, oxidation of the power supply conductive members and the connection portions between the power supply conductive members and the electrical circuit in the region can be effectively prevented.

In the workpiece holder in accordance with the first aspect of the present invention, the rate of helium leak from the region surrounded by the sealing member, the tubular member, and the ceramic body (the sealed region) to other region may be $10^{-8}$ Pa·$m^3$/s or less.

In this case, when the rate of helium leak in the sealed region is set to a value within the above-mentioned range, oxidation of the power supply conductive members and the connection portions between the electrical circuit and the power supply conductive members which are located in the region can be prevented without fail.

The workpiece holder in accordance with the first aspect of the present invention may further comprise a bond member provided at the bonding portion between the tubular member and the sealing member.

In this case, gaps at the bonding portion between the tubular member and the sealing member can be filled with the bond member. As a result, the airtightness of the bonding portion described above can be improved. Accordingly, the first region inside the tubular member can be isolated securely from an outer region surrounding the workpiece holder.

In the workpiece holder in accordance with the first aspect of the present invention, the bond member may have a surface extending from a part of the inside surface of the tubular member onto a part of a surface of the sealing member, and the surface of the bond member preferably is a concave meniscus.

When the bond member has the shape (so-called meniscus) described above, it is understood that the bond member has good wettability to the surfaces of the sealing member and the tubular member. That is, when the bond member has such concave meniscus, the bonding portion has high airtightness. As a result, leak generation at the bonding portion can be reliably suppressed.

A workpiece holder in accordance with a second aspect of the present invention comprises a ceramic body which has an electrical circuit and which is used for holding a workpiece: a tubular member having an end portion fixed to the rear surface of the ceramic body; power supply conductive members electrically connected to the electrical circuit at connection portions located inside the tubular member; and sealing members which are disposed inside the tubular member and fixed to the rear surface of the ceramic body so as to form sealed portions each surrounding the respective connection portions such that the sealing members isolate the sealed portions of the connection portions from an atmosphere surrounding the outer periphery of the sealing member.

Accordingly, the connection portions between the electrical circuit in the ceramic body and the power supply conductive members are each located in a region surrounded by the sealing member and the ceramic body. When the bonding region between the sealing member and the ceramic body is formed so as to have predetermined airtightness, the regions in which the connection portions are located are isolated from a space surrounding the sealing member. Consequently, when a heating treatment such as etching is performed, it is possible to prevent an occurrence of the problem that the electrical circuit or materials forming the connection portions are corroded by oxygen in the air present inside the tubular member.

In addition, since the sealing members are disposed inside the tubular member, and the above-mentioned connection portions are isolated (sealed) from the region surrounding the sealing members, it is unnecessary to install plumbing for supplying an inert gas into the tubular member. Accordingly, the structure of a workpiece holder can be simplified, and hence the manufacturing cost thereof can be reduced. In addition, when workpieces are processed (etching or the like) using the workpiece holder, there is no need to supply an inert gas inside the tubular member, and hence, the running cost of treatment using the workpiece holder can be reduced.

Furthermore, by selecting materials having thermal expansion coefficients, which are not so different from each other, for the ceramic body, the tubular member, the sealing member, and the power supply conductive member, which constitute the workpiece holder, it is possible to avoid a problem such as local concentration of thermal stress due to change in the atmospheric temperature. Accordingly, a workpiece holder having high reliability against heat history such as heat cycle can be realized.

In addition, since the sealing members are provided for the individual connection portions between the electrical circuits and the power supply conductive members, as described above, the size of each of the sealing members can be decreased. Accordingly, the cost of the sealing member can be reduced. In addition, since the area in which the sealing members are in contact with the ceramic body is decreased, the influence of the sealing member on a temperature distribution in the ceramic body can be reduced. As a result, the temperature distribution in the ceramic body can be made more uniform, and hence a temperature distribution in a workpiece, which is held on the ceramic body, can be easily made uniform.

In the workpiece holder in accordance with the second aspect of the present invention, the atmosphere surrounding the regions in which the connection portions between the electrical circuits and the power supply conductive members are located is preferably vacuum or non-oxidizing atmosphere.

In this case, oxidation of the power supply conductive member and the connection portion between the electrical circuit and the power supply conductive member can be effectively prevented.

In the workpiece holder in accordance with the second aspect of the present invention, the rate of helium leak from the region in which the connection portion is located to other region is preferably $10^{-8}$ Pa·m$^3$/s or less.

In this case, when the helium leak rate of the region described above is set as mentioned above, oxidation of the power supply conductive member and the connection portion between the electrical circuit and the power supply conductive member can be reliably suppressed.

The workpiece holder in accordance with the second aspect of the present invention may further comprise a bond member provided at the bonding portion between the ceramic body and the sealing member.

In this case, in the bonding portion between the ceramic body and the sealing member, gaps therebetween can be filled with the bond member. As a result, the airtight property of the bonding portion described above can be improved. Accordingly, the region in which the connection portion between the electrical circuit and the power supply conductive member is located can be securely isolated from the region surrounding the sealing member.

In the workpiece holder in accordance with the first or the second aspect of the present invention, the bond member may be formed by heat treatment of a bond material at a pressure of 100 g/cm$^2$ or more applied thereto through the sealing member.

In this case, since the number of minute gaps can be reduced in the bond member, a bonding portion having superior airtightness can be obtained. Accordingly, the rate of helium leak from the region surrounded by the sealing member, the tubular member, and the ceramic body to other region in which the connection portion between the electrical circuit and the power supply conductive member is located to other region can be reduced (that is, airtightness can be improved). In addition, the bonding strength of the bonding portion between the tubular member and the sealing member or the bonding strength of the bonding portion between the ceramic body and the sealing member can be increased. Thus, more reliable bonding portion can be obtained. The reason for setting the pressure applied to the bond material to 100 g/cm$^2$ or more is that if the pressure is 100 g/cm$^2$ or more, helium leak rate can be reduced, and if the pressure is less than 100 g/cm$^2$, the helium leak rate can hardly be reduced.

In addition, in this case, the bond material may contain glass. This bond material containing glass may be formed beforehand by pre-firing into a shape approximately similar to a bond member. Subsequently, the bond material thus pretreated may be disposed at a predetermined position and processed by heat treatment. Thus, bonding and sealing can be easily made at the bonding portion.

In the workpiece holder in accordance with the second aspect of the present invention, the bond member may have a surface extending from a part of the rear surface of the ceramic body onto a part of the surface of the sealing member, and the surface of the bond member preferably is a concave meniscus.

In the case described above, when the bond member forms a so-called meniscus shape as described above, it is understood that the bond member has good wettability to the surfaces of the sealing member and the ceramic body. That is, when the bond member has the concave meniscus, the bonding portion has high airtightness. As a result, the occurrence of leak at the bonding portion can be securely prevented.

In the workpiece holder in accordance with the first or the second aspect of the present invention, the bond member may include glass.

When a ceramic material is used for the bond member, the heat treatment temperature is increased to 1,500° C. or more in the process of forming the bond member at the bonding portion. In this process, when the sealing member and the power supply conductive member are bonded together beforehand, a material capable of withstanding a high temperature of 1,500° C. or more must be used for forming this power supply conductive member. Therefore, the kind of material that can be used for forming the power supply conductive member is very limited.

In contrast, when glass is used for the bond member, the heat treatment temperature for forming the bond member at the bonding portion can be decreased to a relatively low temperature (approximately 1,000° C. or less). Accordingly, the freedom of selecting a material for the power supply conductive member can be increased.

In the case in which the sealing member or the tubular member is formed of ceramic, if a metal brazing material is used as a typical bond member, thermal stress caused by heat cycle or the like may be concentrated at the bonding portion since ceramic has a thermal expansion coefficient smaller than that of a metal brazing material. As a result, the bonding portion may be damaged by the thermal stress in some cases. In contrast, the thermal expansion coefficient of glass is relatively lower than that of a metal brazing material or the like. Accordingly, when a suitable kind of glass for a bond member is selected, the thermal expansion coefficient of the bond member can be made approximately equivalent to that of ceramic forming the tubular member or the like. As a result, concentration of thermal stress at the bonding portion can be suppressed. Consequently, breakage of the bonding portion caused by thermal stress can be suppressed, and hence a workpiece holder having high reliability can be obtained.

In the workpiece holder in accordance with the first or the second aspect of the present invention may comprise another bond member provided, the portion for bonding the sealing member and the power supply conductive member may have an additional bond member provided therebetween. The additional bond member may have a surface extending from a part of a surface of the sealing member onto a part of the surface of the power supply conductive member, and the surface of the bond member preferably is a concave meniscus When the additional bond member forms a meniscus shape as described above, it is understood that the bond member has good wettability to the surfaces of the sealing member and the power supply conductive member. That is, when the additional bond member has such a meniscus shape as described above, the bonding portion between the sealing member and the power supply conductive member has high airtightness. As a result, the occurrence of leakage at the bonding portion can be effectively prevented.

In the holder in accordance with the first or the second aspect of the present invention, the additional bond member may include glass.

In this case, when glass for a bonding material is used for the additional bond member, the heat treatment for forming the bond member at the bonding portion between the sealing member and the power supply conductive member can be performed at a relatively low temperature (approximately 1000° C. or less). Accordingly, a greater freedom for selecting a material for forming the power supply conductive member can be obtained.

In the workpiece holder in accordance with the first or the second aspect of the present invention, the glass may be $ZnO$—$SiO_2$—$B_2O_3$-based glass.

The $ZnO$—$SiO_2$—$B_2O_3$-based glass has a thermal expansion coefficient equivalent to that of ceramic, and such glass has good wettability to the tubular member and the sealing member that are made of ceramic. Accordingly, when the $ZnO$—$SiO_2$—$B_2O_3$-based glass is used as the bond member, airtightness and reliability of the bonding portion can be improved.

In the workpiece holder in accordance with the first or the second aspect of the present invention, the sealing member may include a material equivalent to that forming the tubular member.

In this case, the sealing member and the tubular member can be formed of materials having thermal expansion coefficients equivalent to each other. Accordingly, at the bonding portion between the sealing member and the tubular member, concentration of thermal stress caused by the difference in thermal expansion coefficient of the materials forming the sealing member and the tubular member can be suppressed Hence, the reliability of the bonding portion described above can be improved.

In the workpiece holder in accordance with the first or the second aspect of the present invention, the sealing member may include a material equivalent to that forming the ceramic body.

In this case, the sealing member and the ceramic body can be formed of materials having thermal expansion coefficients equivalent to each other. Accordingly, at the bonding portion between the sealing member and the ceramic body, concentration of thermal stress caused by the difference in thermal expansion coefficient of the materials forming the sealing member and the ceramic body can be suppressed. Hence, the reliability of the bonding portion described above can be improved.

In the workpiece holder in accordance with the first or the second aspect of the present invention, the ceramic body may include aluminum nitride.

Aluminum nitride has high corrosion-resistance against halogenated gases used for processing semiconductor substrates. In addition, the rate of particle generation of the ceramic body made of aluminum nitride is smaller than the rate of particle generation of that made of a material other than aluminum nitride. Furthermore, since the thermal conductivity of aluminum nitride is relatively high, a temperature distribution on a surface (surface on which a workpiece such as a semiconductor substrate is mounted) of the ceramic body can be made uniform.

In the workpiece holder in accordance with the first or the second aspect of the present invention, the power supply conductive member may include an iron-nickel-cobalt alloy.

The difference in thermal expansion coefficient between the iron-nickel-cobalt alloy mentioned above and ceramic is relatively small. Accordingly, it is possible to decrease thermal stress generated at the bonding portion between the power supply conductive member and the sealing member when the bonding portion between the power supply conductive member and the sealing member is formed and when the workpiece holder is subjected to a heat cycle.

In addition, the iron-nickel-cobalt alloy described above has superior wettability to glass used as the bond member. Accordingly, the reliability of the bonding portion between the power supply conductive member and the sealing member can be improved.

In the workpiece holder in accordance with the first or the second aspect of the present invention, the power supply conductive member may include a base material and a coating layer. The base material may contain at least one selected from the group consisting of tungsten, molybdenum, and an alloy thereof. The coating layer may be formed on a surface of the base material and may contain at least one of nickel and gold. In addition, the coating layer may be a plating layer containing at least one of nickel and gold.

In this case, the oxidation-resistance of a metal, such as tungsten, which forms the base material is not particularly superior; however, the oxidation-resistance of the power supply conductive member can be improved by applying a coating layer containing nickel or gold thereon. In addition, the material forming the base material described above is a metal having a relatively low thermal expansion coefficient. Accordingly, when heat is applied to the bonding portion in the process of bonding the power supply conductive member and the sealing member together, for example, thermal stress generated thereby can be decreased.

A processing apparatus in accordance with a third aspect of the present invention comprises the workpiece holder in accordance with the first or the second aspect of the present invention.

By using a highly reliable workpiece holder made at a relatively reasonable cost as described above, it is possible to manufacture a highly reliable processing apparatus in which the treatment of workpieces such as substrates can be performed at a low cost.

Susceptors for use in semiconductor manufacturing apparatuses have been required to be manufactured at a reasonable cost and also to be able to withstand severe conditions as in the case of etching treatment for a semiconductor substrate. The workpiece holder of the present invention can be fabricated, at a low cost, and can withstand severe operation conditions for use in a semiconductor manufacturing apparatus.

Embodiments

Hereinafter, embodiments of the present invention will be described with reference to figures. In the figures shown below, the same or the equivalent constituent element designates the same reference numeral, and the description thereof will not be repeated.

First Embodiment

Figure 2:
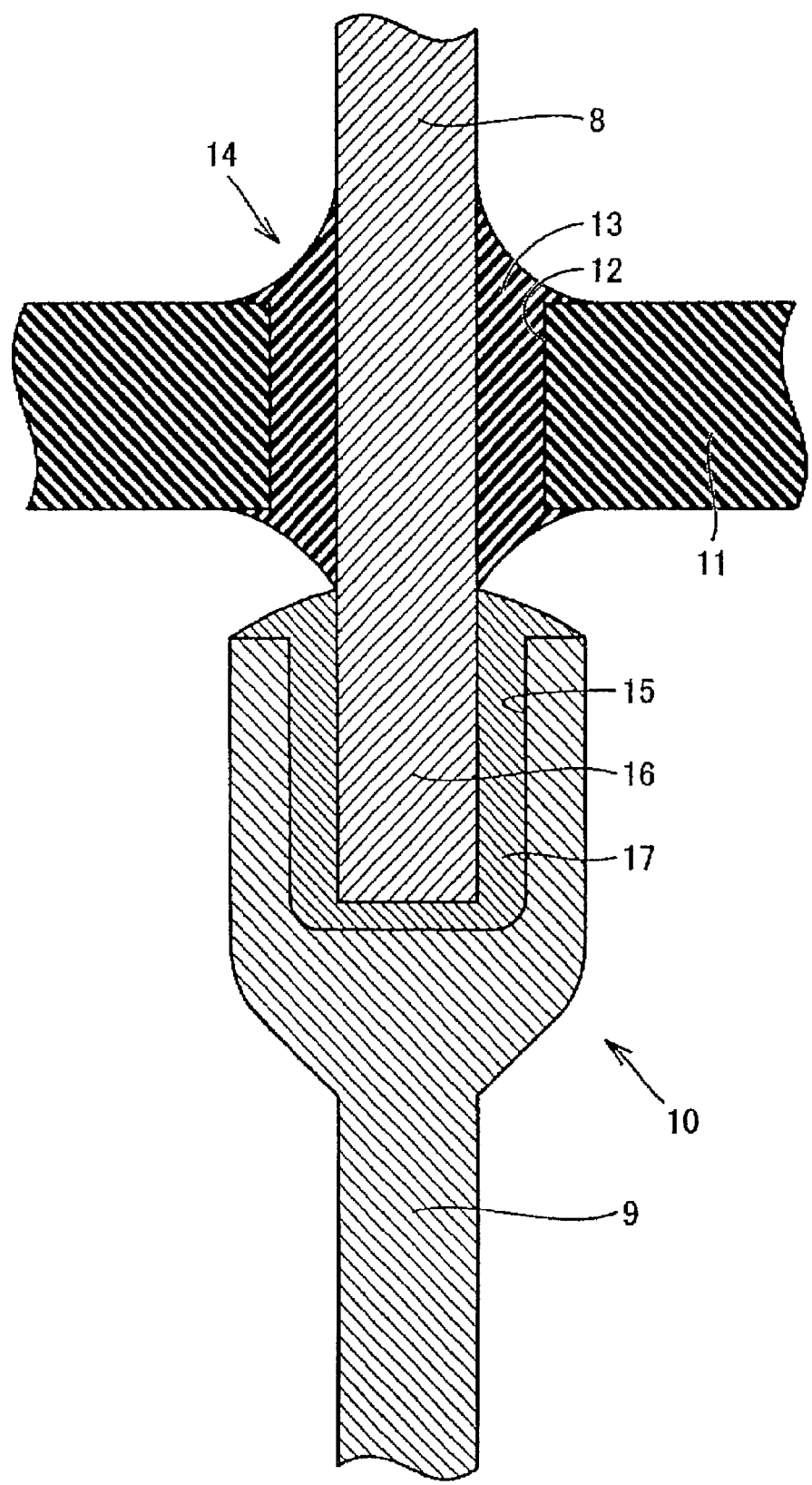
FIG. 2 is a schematic, enlarged, cross-sectional view showing a part of the workpiece holder shown in FIG. 1.
Figure 3:
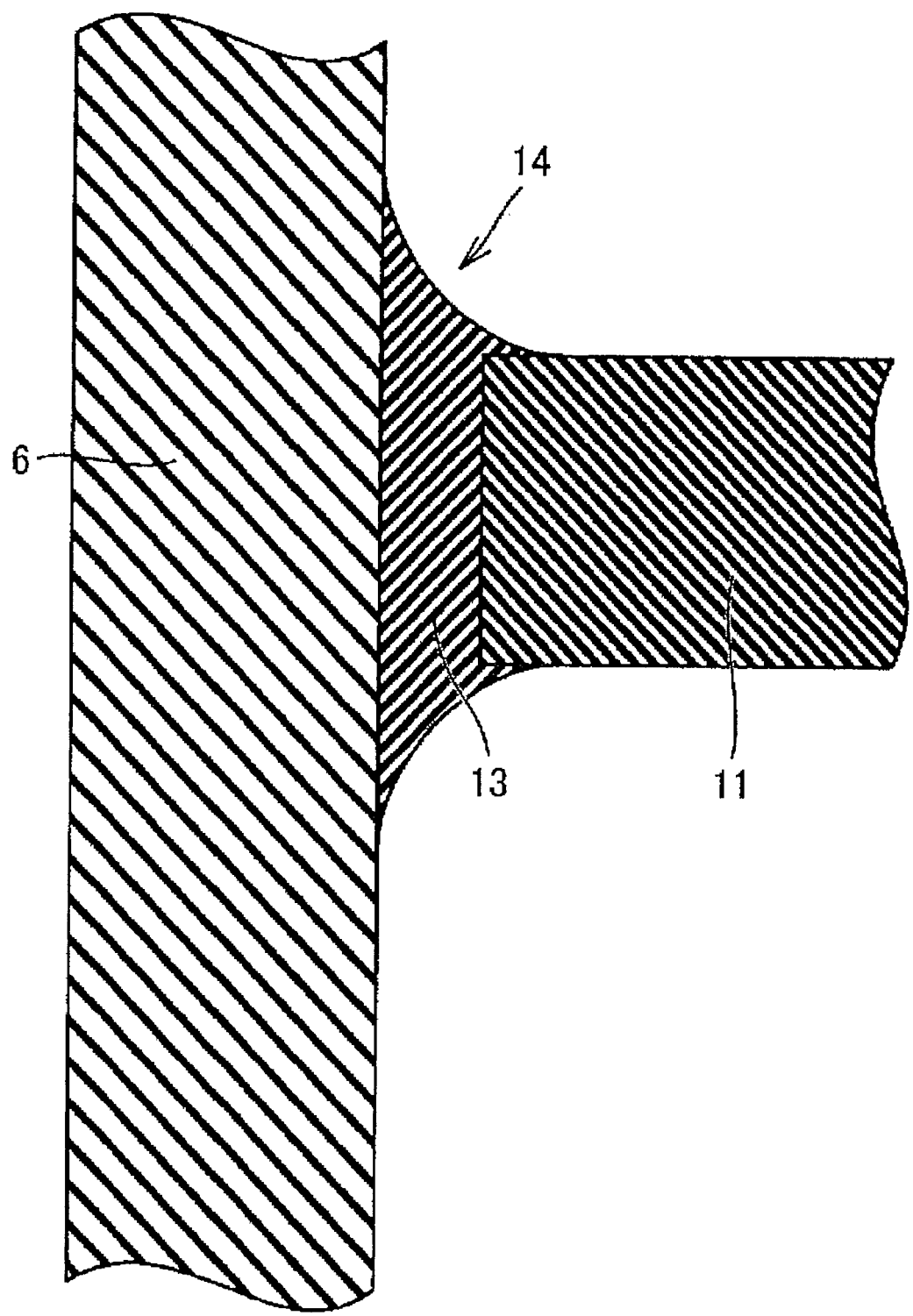
FIG. 3 is a schematic, enlarged, cross-sectional view showing a part, which is different from that shown in FIG. 2, of the workpiece holder shown in FIG. 1.

FIG. 1 is a schematic cross-sectional view showing a workpiece holder, which is used in a processing apparatus, according to a first embodiment of the present invention. FIG. 2 is a schematic, enlarged, cross-sectional view showing a part of the workpiece holder shown in FIG. 1. FIG. 3 is a schematic, enlarged, cross-sectional view showing a part, which is different from that shown in FIG. 2, of the holder shown in FIG. 1. Referring FIGS. 1 to 3, the holder according to the first embodiment of the present invention will be described.

As shown in FIGS. 1 to 3, a holder 1, which is a susceptor disposed inside a chamber of a processing apparatus, comprises a ceramic body 2, and a tubular member 6 bonded to this ceramic body 2 at the rear surface side thereof. The tubular member 6 is made of ceramic. The holder 1 is bonded to a wall surface (not shown) of the chamber at the bottom portion of the tubular member 6. As the processing apparatus, for example, there may be mentioned a semiconductor manufacturing apparatus, such as an etching apparatus or a film-forming apparatus, used in steps of manufacturing semiconductor substrates.

The ceramic body 2 holds on the surface thereof a workpiece such as a semiconductor substrate. The ceramic body 2 comprises a body base 3 made of ceramic and electrical circuits including electrode 4 and a heater circuit 5 embedded in this body base 3. The electrode 4 may be an electrostatic chucking electrode for holding a workpiece such as a substrate on the surface of the ceramic body 2 or may be a plasma-generating (radio frequency (RF)) electrode used for generating plasma for processing the substrate. In addition, both electrostatic chucking electrode and plasma-generating electrode may be formed in the ceramic body 2.

Power supply terminals 7a to 7c are connected to the electrical circuits of the electrode 4 and the heater circuit 5. These power supply terminals 7a to 7c are made of a conductive material such as a metal and are embedded in the ceramic body 2. One end of each of the power supply terminals 7a to 7c is exposed at the surface of the ceramic body 2 inside the tubular member 6. Terminal-side electrode lines 8 used as power supply conductive members are disposed so as to be in contact with these corresponding power supply terminals 7a to 7c. The terminal-side electrode lines 8 are disposed inside the tubular member 6. These terminal-side electrodes 8 are connected to corresponding power-side electrode lines 9 at connection portions 10 with a gold (Au) brazing material 17 Nickel (Ni) may be used as a material for the power-side electrode line 9. In addition to nickel (Ni), a conductive material having oxidation-resistance can be used as the material for the power-side electrode line 9. A screw-in structure may be used as a joint structure between the terminal-side electrode line 8 and the power-side electrode line 9. For example, a thread part may be formed at an end portion of the terminal-side electrode line 8, and a threaded hole in which the thread part is inserted and fixed may be formed at an end portion of the power-side electrode line 9, the end portion being opposing the terminal-side electrode line 8. Subsequently, the terminal-side electrode line 8 and the corresponding power-side electrode line 9 may be connected and fixed together by inserting the thread part into the threaded hole and fixing together.

At the connection portions 10 between the terminal-side electrode lines 8 and the power-side electrode lines 9, as shown in FIG. 2, end opening portions 15 are formed in the end portions of the power-side electrode lines 9. The end portions (end portions opposite to the ends connected to the power supply terminals 7a to 7c) of the terminal-side electrode lines 8 are inserted into these corresponding end opening portions 15, and in the state described above, the Au brazing material 17 is filled inside the end opening portions 15.

In addition, inside the tubular member 6, a sealing member 11 made of ceramic is disposed in a region located above the connection portions 10 between the terminal-side electrode lines 8 and the power-side electrode lines 9. The shape of the sealing member 11 in plan view is approximately equivalent to the inside periphery of the tubular member in the direction perpendicular to that in which the tubular member 6 extends. In addition, a plurality of openings 12 is formed in the sealing member 11. The terminal-side electrode lines 8 are disposed so as to pass through these openings 12.

The terminal-side electrode lines 8 and the sealing member 11 are fixed together at the openings 12 with an additional bond member using glass 13. The glass 13 serves as a sealing material for filling up the openings 12, which are the bonding portions, such that a sealed region (a space in the first end portion side in the tubular member 6), which is surrounded by the tubular member 6, the sealing member 11, and the ceramic body 2 is isolated by the sealing member from other regions (opposite region, which is opposite to the sealed region in the tubular member 6, and outer space surrounding the outer periphery of the holder 1). In addition, the sealing member 11 and the tubular member 6 are bonded to and fixed to each other by the glass 13 functioning as a bond member. As a result, the sealing chamber 11 can isolate the sealed region inside the cylinder member 6 from the opposite region, which is opposite to the sealed region, inside the cylinder member. Furthermore, the terminal-side electrode lines 8 used as the power supply conductive members extend from the opposite region, penetrate the sealing member 11 through the opening 12, to the sealed region inside the tubular member 6 and are connected to the electrode 4 and the heater circuit 5 via the power supply terminals 7a to 7c.

The glass 13 located at the bonding portion between the sealing member 11 and the terminal-side electrode lines 8 and the glass 13 located at the bonding portion between the sealing member 11 and the tubular member 6 form meniscus portions 14. The meniscus portions 14 described above are formed when the wettability of the glass 13 to the surfaces of the sealing member 11, the terminal-side electrode line 8, and the tubular member 6 is superior. When the meniscus portions 14 is formed as described, the bonding portion exhibit high reliability, and leakage is unlikely to occur.

The glass 13 located at the bonding portion between the sealing member 11 and the terminal-side electrode lines 8 and the glass 13 located at the bonding portion between the sealing member 11 and the tubular member 6 may be formed by performing heat treatment while a pressure of 100 g/cm$^2$ or more is applied to the glass 13 through the sealing member 11. According to such treatment, the number of minute gaps can be reduced in the glass 13. Hence, in addition to improvement in airtight property, the bonding strength of the bonding portion containing the glass 13 can be improved.

A material having low oxidation-resistance, such as tungsten (W) or molybdenum (Mo), is used as a material for forming the heater circuit 5 or the electrodes 4. Similarly, the power supply terminals 7a to 7c are made of a material having low oxidation-resistance in some cases. In the holder 1 of the present invention, the connection portions between the terminal-side electrode lines 8 and power supply terminals of the heater circuit 5 or the like of the ceramic body 2 are located in the sealed region (region at the first end portion side of the tubular member) surrounded by the sealing member 11, the tubular member 6, and the ceramic body 2. Accordingly, if the bonding region between the tubular member 6 and the ceramic body 2, the bonding region between the tubular member 6 and the sealing member 11, and the bonding regions between the sealing member 11 and the terminal-side electrode lines 8 are formed so as to have predetermined airtightness, the region in which the connection portions between the terminal-side electrode lines 8 and the power supply terminals 7 for the heater circuit 5 and the like are located becomes isolated from the atmosphere (other region) surrounding the holder 1. Hence, when processing such as etching is performed, it is possible to prevent occurrence of the problem that the connection portions and the power supply terminals 7 for the heater circuit 5 and the electrode 4 may be corroded by reacting gases present in the atmosphere around the holder 1.

In addition, since the sealing member 11 is disposed inside the tubular member 6 so that the first region described above, that is, the region in the tubular member 6 at the first end portion side, is isolated from the region other than the first region described above, plumbing for supplying an inert gas into the tubular member 6, which has been performed in the past, is not necessary. Since the structure of the holder 1 can be simplified compared to that in the past, the manufacturing cost can be reduced. In addition, when a semiconductor substrate, that is, a workpiece, is processed (etching or the like) using the holder 1, it is not necessary to continuously supply an inert gas into the tubular member 6, and hence, the running cost can be reduced by using the holder 1.

Moreover the occurrence of a problem such as local concentration of thermal stress caused by the change in an atmospheric temperature can be suppressed if suitable materials having thermal expansion coefficients which are not so different from each other are selected as materials for the ceramic body 2, the tubular member 6, the sealing member 11, and the terminal-side electrode lines 8, which form the holder 1. Accordingly, a holder 1 having high reliability against thermal hysteresis due to heat cycle can be obtained.

In the holder 1 shown in FIGS. 1 to 3, since the sealing member 11 is disposed at a distance from the surface of the ceramic body 2, the sealing member 11 is not in contact therewith. Consequently, it is possible to prevent occurrence of the problem that the temperature distribution in the ceramic body 2 becomes uneven because of the sealing member 11 being in contact with the ceramic body 2. As a result, the uniformity in temperature distribution in the ceramic body 2 can be further improved.

Since the glass 13 used as the bond member is provided at the bonding portion between the tubular member 6 and the sealing member 11, gaps between the sealing member 11 and the tubular member 6 can be filled with the glass 13. As a result, the airtight property of the bonding portion described above can be improved.

In addition, since the thermal expansion coefficient of the glass 13 is relatively low than that of gold brazing material or the like, the thermal expansion coefficient of the glass 13 can be made approximately equivalent to that of ceramic forming the tubular member 6 if an appropriate type of glass 13 for the bond member is selected among various materials. As a result, concentration of thermal stress at the bonding portion can be suppressed.

As shown in FIG. 3, the glass 13 has a surface extending from a part of the surface of the tubular member 6 to a part of the surface of the sealing member 11, and the glass has a concave cross-sectional shape (a so-called meniscus portion 14 is formed). The meniscus portion 14 described above is formed when the glass 13 has good wettability to the surfaces of the tubular member 6 and the sealing member 11. That is, when the bond member has the concave meniscus, the bonding portion has high airtightness.

In addition, in the holder 1 shown in FIGS. 1 to 3, the glass 13 is provided as an additional bond member at the bonding portions between the sealing member 11 and the terminal-side electrode lines 8. As shown in FIG. 2, the glass 13 has a surface extending from a part of the surface of the sealing member 11 onto a part of the surface of the terminal-side electrode line 8, and the surface of the glass 13 is a concave meniscus (a meniscus portion 14 is formed). When the meniscus portion 14 described above is formed on the surface of the glass 13, it is understood that the glass 13 has good wettability to the surfaces of the sealing member 11 and the terminal-side electrode lines 8. That is, when the meniscus portion 14 described above is formed, the bonding portions between the sealing member 11 and the terminal-side electrode lines 8 have a high airtight property. In addition, when the glass 13 is used as said another bond member, a heat treatment step of providing the glass 13 at the bonding portions between the sealing member 11 and the terminal-side electrode lines 8 can be performed at a relatively low temperature (approximately 1,000° C. or less). As a result, the degree of freedom for selecting a material forming the terminal-side electrode lines 8 can be made larger.

As the glass 13, $ZnO$—$SiO_2$—$B_2O_3$-based glass may be used. $ZnO$—$SiO_2$—$B_2O_3$-based glass has a thermal expansion coefficient equivalent to that of ceramic and superior wettability to the tubular member 6 and the sealing member 11 that are made of ceramic. Therefore, if such $ZnO$—$SiO_2$—$B_2O_3$-based glass is used as the glass 13, the airtightness and reliability of the bonding portion can be improved.

In addition, a material forming the sealing member 11 may contain the same material as that forming the tubular member 6. When the material is thus selected, the sealing member 11 can be formed of a material having a thermal expansion coefficient approximately equivalent to that of the tubular member 6. Accordingly, it is possible to prevent the thermal stress from being concentrated at the bonding portion between the sealing member 11 and the tubular member 6 because of the difference in thermal expansion coefficient between the materials of the sealing member 11 and the tubular member 6.

A material forming the sealing member 11 may contain the same material as that for the body base 3 forming the ceramic body 2.

In the case described above, the sealing member 11 and the ceramic body 2 can be formed of materials having thermal expansion coefficients approximately equivalent to each other. Accordingly, when the sealing member 11 and the ceramic body 2 are directly bonded together as in the case of the holder 1 described later in a third embodiment of the present invention, it is possible to prevent the thermal stress from being concentrated at the bonding portion because of the difference in thermal expansion coefficient between the materials of the sealing member 11 and the ceramic body 2.

A material for the body base 3 forming the ceramic body 2 may contain aluminum nitride. Aluminum nitride has high corrosion resistance against halogenated gases used for processing a semiconductor substrate. In addition, the ceramic body 2 containing aluminum nitride exhibits a lower rate of generation of particles compared with a ceramic body containing other material. Furthermore, since the thermal conductivity of aluminum nitride is relatively high, a temperature distribution on a surface (surface on which a workpiece such as a semiconductor substrate is mounted) of the ceramic body 2 can be made uniform.

In addition, the region surrounded by the sealing member 11, the tubular member 6, and the ceramic body 2 is preferably in an evacuated or a non-oxidizing state. In this case, oxidation can be effectively suppressed from occurring at the terminal-side electrode lines 8, or the connection portions between the terminal-side electrode lines 8 and the power supply terminals for the heater circuit 5 or the electrode 4, which are located in the region described above.

An ion-nickel-cobalt alloy may be used as a material for forming the terminal-side electrode lines 8. In this case, the thermal expansion coefficient of an ion-nickel-cobalt alloy is not so different from that of ceramic. Accordingly, the thermal stress generated at the bonding portion between the terminal-side electrode line 8 and the sealing member 11 can be suppressed when the bonding portion between the terminal-side electrode line 8 and the sealing member 11 made of ceramic is formed, and when the holder 1 is subjected to heat cycle. In addition, the ion-nickel-cobalt alloy described above has superior wettability to glass used as the bond member. Hence, the reliability of the bonding portion between the terminal-side electrode line 8 and the sealing member 11 can be improved.

The terminal-side electrode line 8 used as the power supply conductive member may comprise a base material containing at least one selected from the group consisting of tungsten (W), molybdenum (Mo), and an alloy thereof and a plating layer which is formed on the base material and which serves as a coating layer containing at least one of nickel and gold. In this case, the difference in thermal expansion coefficient between ceramic and the above-mentioned metal forming the base material is relatively small. Accordingly, when the bonding portion between the terminal-side electrode line 8 and the sealing member 11 is formed, concentration of thermal stress generated at the bonding portion, which is caused by the difference in thermal expansion coefficient between the terminal-side electrode line 8 and the sealing member 11, can be suppressed.

The rate of helium leak from the sealed region surrounded by the sealing member 11, the tubular member 6, and the ceramic body 2 to other region is preferably $10^{-8}$ Pa·m³/s or less. In this case, oxidation of the terminal-side electrode lines 8 and the connection portions between the terminal-side electrode 8 and the power supply terminals for the heater circuit 5 and the electrode 4, which are located in the sealed region, can be securely suppressed.

When the holder 1 shown in FIGS. 1 to 3 is applied to a processing apparatus for processing a semiconductor substrate, a semiconductor substrate can be processed at an inexpensive cost, and in addition to that, a processing apparatus having high reliability can be realized.

Second Embodiment

Figure 4:
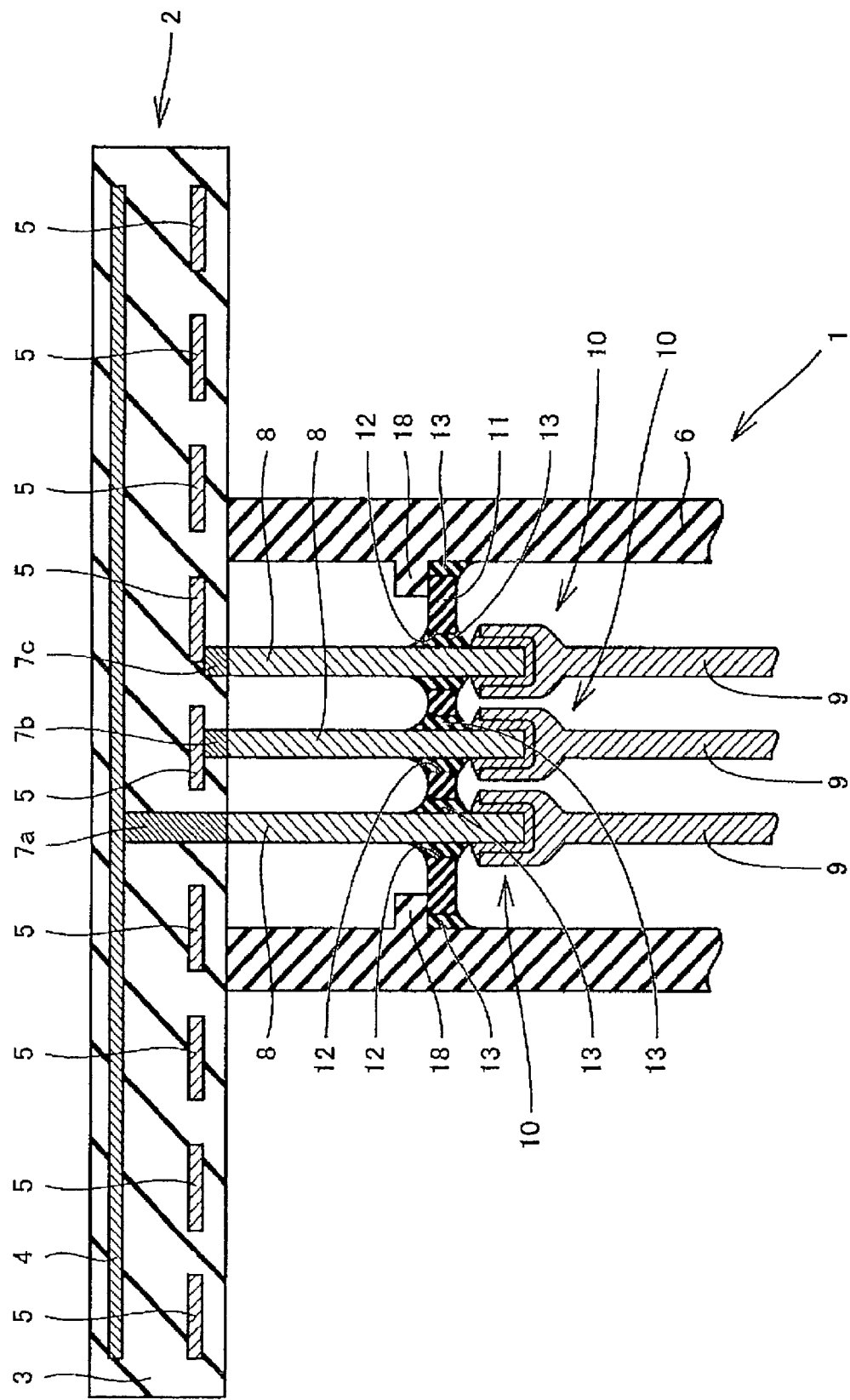
FIG. 4 is a schematic, cross-sectional view of a workpiece holder according to a second embodiment of the present invention.

FIG. 4 is a schematic, cross-sectional view of a holder according to a second embodiment of the present invention. With reference to FIG. 4, the holder according to the second embodiment of the present invention will be described.

As shown in FIG. 4, the holder 1 of this embodiment has the structure basically equivalent to that shown in FIGS. 1 to 3; however, a protruding portion 18 for defining the position of the sealing member 11 is formed on the inside wall of the tubular member 6. While an end portion of the sealing member 11 is pressed against this protruding portion 18, the tubular member 6 and the sealing member 11 are bonded and fixed together with the glass 13 provided therebetween.

According to the structure described above, the same advantage as that of the holder 1 shown in FIGS. 1 to 3 can be obtained, and at the same time, by the presence of the protruding portion 18, an area at which the tubular member 6 and the sealing member 11 oppose each other can be increased. Accordingly, the reliability of the bonding portion between the tubular member 6 and the sealing member 11 can be increased. As a result, the rate of leak generation can be effectively decreased.

Third Embodiment

Figure 5:
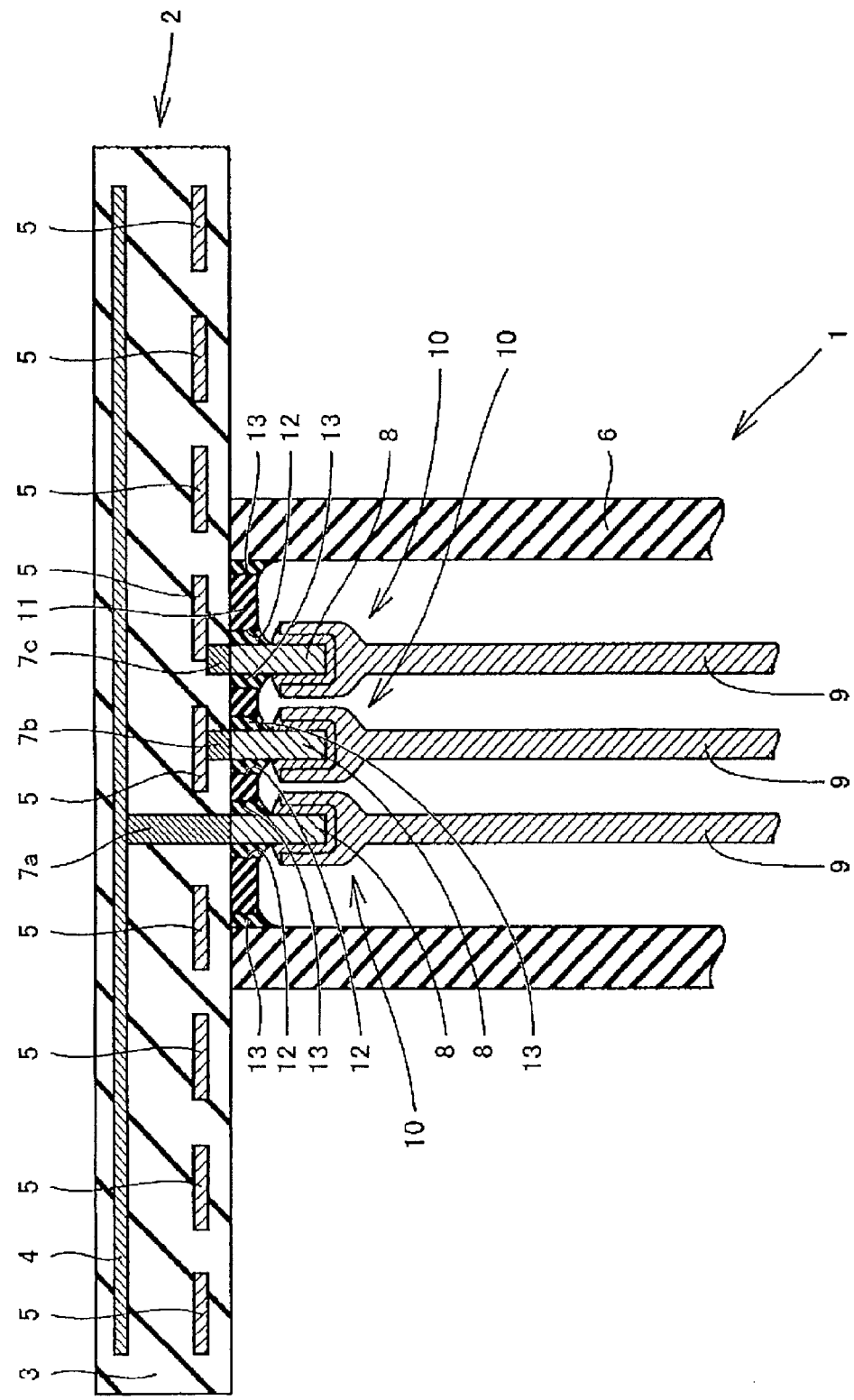
FIG. 5 is a schematic, cross-sectional view of a workpiece holder according to a third embodiment of the present invention.

FIG. 5 is a schematic, cross-sectional view of a holder according to a third embodiment of the present invention With reference to FIG. 5, the holder according to the third embodiment of the present invention will be described.

As shown in FIG. 5, the holder 1 of this embodiment has the structure basically equivalent to that shown in FIGS. 1 to 3; however, the position at which the sealing member 11 is disposed is different. That is, the sealing member 11 is disposed inside the tubular member 6 so as to be in close contact with the rear surface of the ceramic body 2.

In addition, the sealing member 11 thus disposed is fixed to the tubular member 6 and the terminal-side electrode lines 8 with the glass 13.

According to the structure described above, the same advantage as that of the holder 1 shown in FIGS. 1 to 3 can be obtained, and at the same time, since the sealing member 11 is in contact with the rear surface of the ceramic body 2, the ceramic body 2 can hold the sealing member 11. As a result, the thickness of the sealing member 11 can be decreased. Hence, the degree of freedom for designing the sealing member 11 can be made larger.

In addition, in the case described above, by providing glass which functions as a fixing bond member between the ceramic body 2 and the sealing member 11, the ceramic body 2 and the sealing member 11 may be bonded to each other. Accordingly, the same advantage as that of the holder 1 shown in FIG. 4 can be obtained. In addition, the glass provided between the ceramic body 2 and the sealing member 11 may be formed by heat treatment while being pressed at a pressure of 100 g/cm$^2$ or more through the sealing member 11 side. In this case, since the number of minute gaps can be removed by the glass, airtightness of the bonding portion between the ceramic body 2 and the sealing member 11 can be improved, and in addition to this, the bonding strength can be improved.

Fourth Embodiment

Figure 6:
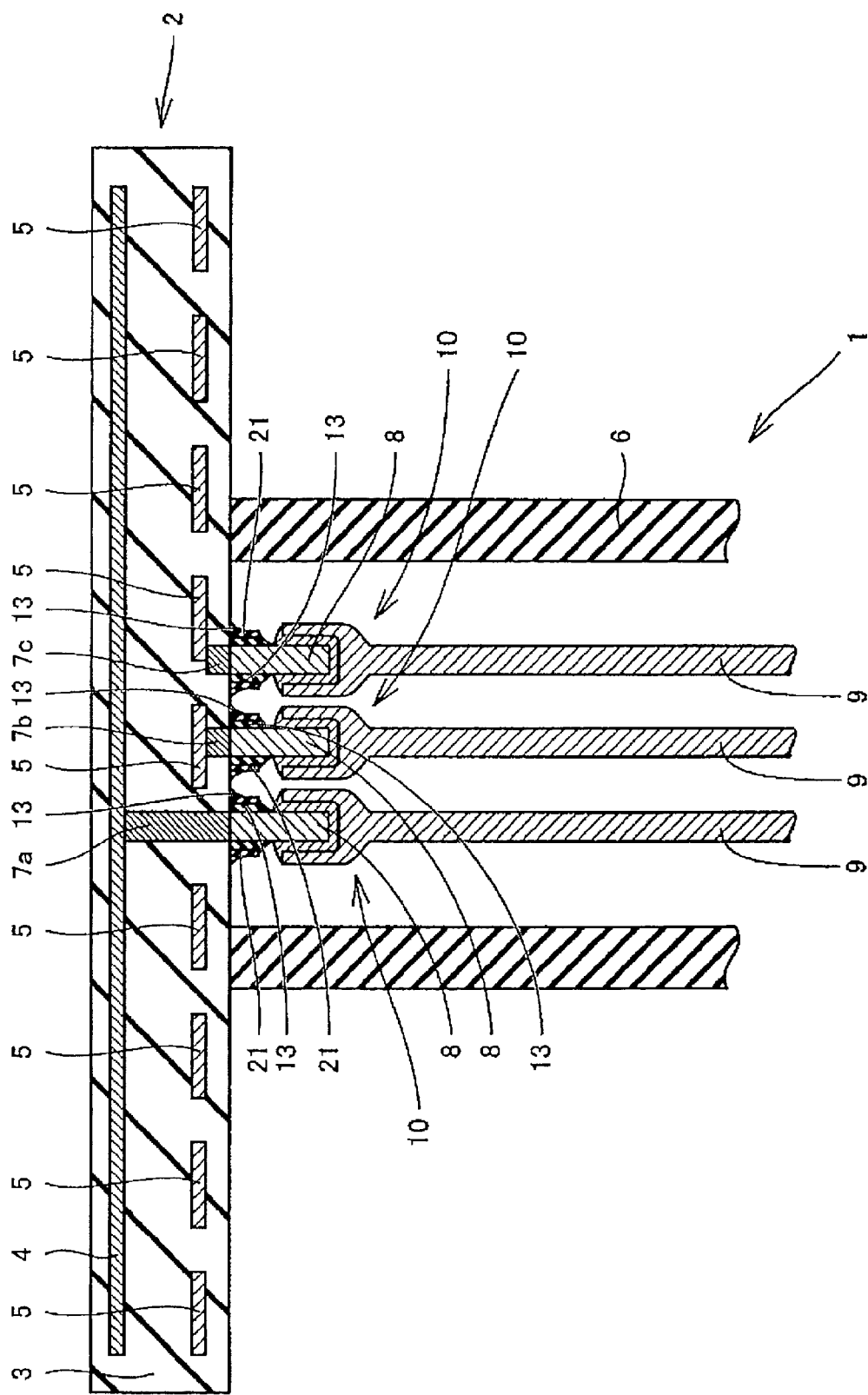
FIG. 6 is a schematic, cross-sectional view of a workpiece holder according to a fourth embodiment of the present invention.
Figure 7:
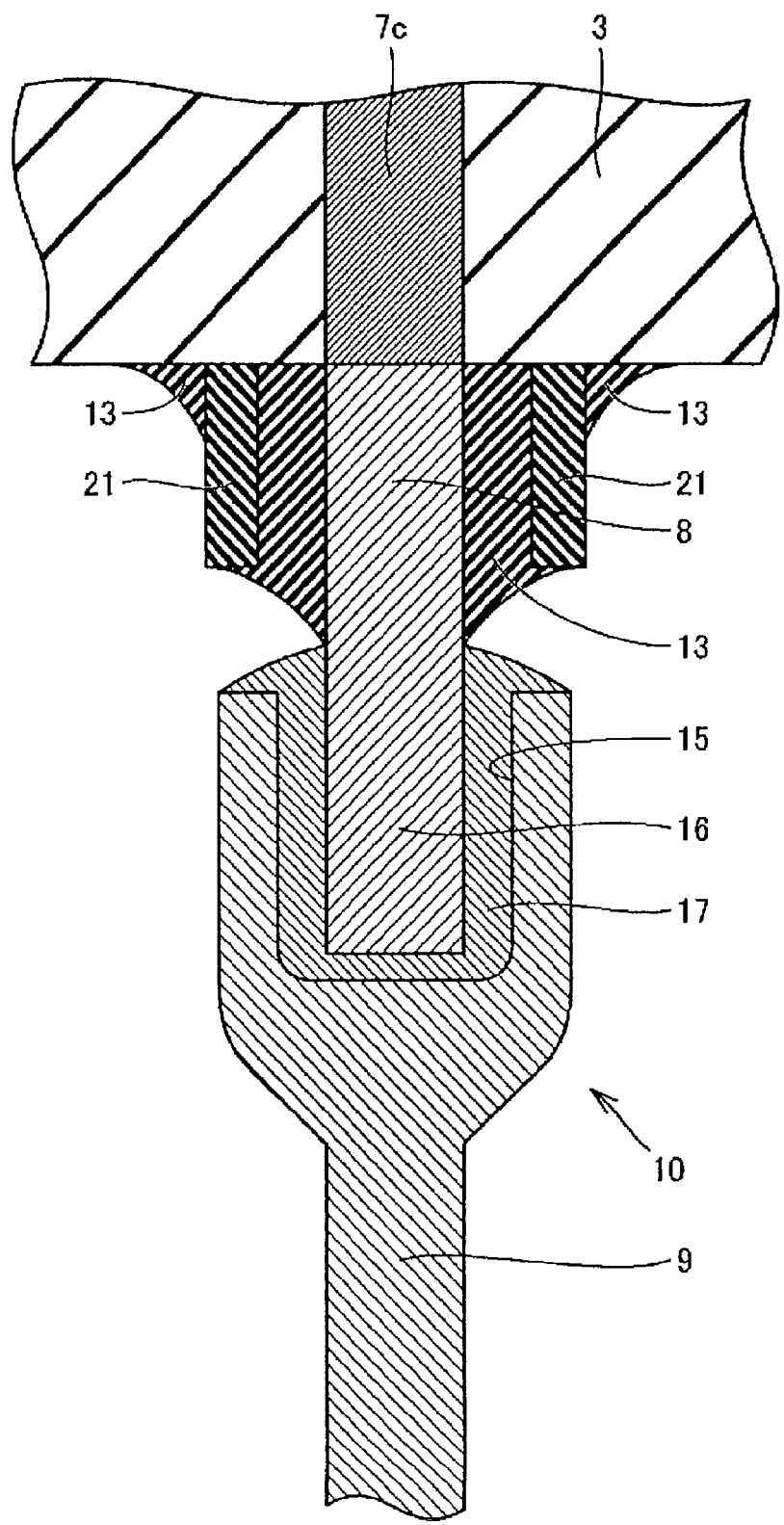
FIG. 7 is a schematic, cross-sectional view of showing a part of the holder shown in FIG. 6.

FIG. 6 is a schematic, cross-sectional view of a holder according to a fourth embodiment of the present invention. FIG. 7 is a schematic, cross-sectional view showing a part of the holder shown in FIG. 6. With reference to FIGS. 6 and 7, the holder according to the fourth embodiment of the present invention will be described.

As shown in FIGS. 6 and 7, the holder 1 used as a susceptor for a semiconductor manufacturing apparatus has the structure basically equivalent to that shown in FIG. 5; however, the structure of a sealing member 21 (see FIG. 6) is different therefrom. That is, in the holder 1 shown in FIGS. 6 and 7, tubular sealing members 21 are disposed inside the tubular member 6 so as to surround the peripheries of the connection portions between the terminal-side electrode lines 8 used as the power supply conductive members and the electrical circuits such as the electrode 4 and the heater circuit 5. The sealing members 21 are bonded to and fixed to the surface of the ceramic body 2, which contains aluminum nitride, with the glass 13. In addition, inside the sealing member 21 (an opening portion in the sealing member 21), the terminal-side electrode line 8 is disposed, and between the terminal-side electrode line 8 and the sealing member 21, the glass 13 is provided as said another bond member. As a material for the terminal-side electrode line 8, an iron-nickel-cobalt alloy may be used. The sealing member 21 isolates the connection portions of the terminal-side electrode lines 8 with the heater circuit 5 and the electrode 4 from the atmosphere surrounding the periphery of the sealing member 21.

The glass 13 functioning as said another bond member has a surface extending from a part of the surface of the sealing member 21 to a part of the surface of the terminal-side electrode line 8, and the glass 13 has a concave cross-sectional shape (so-called meniscus is formed). As a result, as in the case of the holder 1 in the first embodiment of the present invention, a high airtightness can be obtained by means of the glass 13 at the bonding portion between the sealing member 21 and the terminal-side electrode line 8.

In addition, in the holder 1 shown in FIGS. 6 and 7, the connection portions between the terminal-side electrode lines 8 and the electrical circuits of the ceramic body 2, such as the power supply terminals for the heater circuit 5 and the electrode 4, are located in the regions surrounded by the sealing members 21 and the ceramic body 2. When the bonding regions between the sealing members 21 and the ceramic body 2 are formed with the glass 13 so as to have a predetermined airtightness, and the sealing members 21 and the terminal-side electrode lines 8 are fixed together with the glass 13, the regions in which the connection portions are located are isolated from an atmosphere (other region) surrounding the peripheries of the sealing members 21. Accordingly, as in the first embodiment of the present invention, it is possible to prevent an occurrence of the problem that the electrical circuits or materials forming the connection portions are corroded by oxygen in the air present inside the tubular member 6 or the like when heat treatment such as etching is performed.

In addition, since the sealing members 21 are disposed inside the tubular member 6, and the connection portions described above are isolated (sealed) from the region surrounding the peripheries of the sealing members 21, plumbing for supplying an inert gas into the tubular member 6, which has been performed in the past, is not necessary. Accordingly, since the structure of the holder 1 can be simplified, the manufacturing cost can be reduced. In addition, when a workpiece is processed by etching or the like using the holder 1, it is not necessary to continuously supply an inert gas into the tubular member 6, and hence, the running cost can be reduced by using the holder 1.

Materials having thermal expansion coefficients not largely different from each other may be used as materials for the ceramic body 2, the sealing member 21, the terminal-side electrode line 8, and the power-side electrode line 9. In this case, thermal stress can be prevented being locally concentrated at, for example, the bonding portion between the materials for the sealing member 21 and the ceramic body 2 due to the change in ambient temperature.

As described above, since the sealing members 21 are each provided for each of the connection portions between the terminal-side electrode lines 8 and the electrical circuits such as the heater circuit 5 and the electrode 4, the size of the sealing member 21 can be decreased. Accordingly, the cost of the sealing member 21 can be reduced. In addition, since an area at which the ceramic body 2 and the sealing members 21 are in contact with each other can be decreased, influence of the sealing member 21 on a temperature distribution in the ceramic body 2 can be reduced. As a result, since the temperature distribution in the ceramic body 2 can be made more uniform, a temperature distribution of a workpiece such as a semiconductor substrate placed on the ceramic body 2 can also be made uniform.

In the holder 1 shown in FIGS. 6 and 7, the glass 13 is filled as an additional bond member between the terminal-side electrode lines 8 and the sealing members 21 at the connection portions between the terminal-side electrode lines 8 and the power supply terminals for the heater circuit 5 and the electrode 4. In the case, as long as the sealing member 21 and the terminal-side electrode line 8 are securely bonded together and sealed at the bottom of the sealing member 21, a gap may be formed between the inside wall of the sealing member 21 and the terminal-side electrode line 8 at, for example, the central or the upper portion of the sealing member 21. Preferably, the gap should be vacuum or non-oxidizing atmosphere. In this case, the terminal-side electrode lines 8 and the connection portions between the terminal-side electrode lines 8 and the electrical circuits such as the heater circuit 5 can be effectively prevented from being oxidized.

In the holder 1, the rate of helium leak to a region surrounding the sealing member 21 from the region in which the connection portion between the terminal-side electrode line 8 and the electrical circuit such as the heater circuit 5 is located is preferably $10^{-8}$ Pa·m$^3$/s or less. In this case, oxidation of the terminal-side electrode lines 8 and the connection portions between the terminal-side electrode lines 8 and the power supply terminals for the heater circuit 5 and the like, which are located inside the sealing member 21, can be securely suppressed.

In the holder 1, at the bonding portion between the ceramic body 2 and the sealing member 21, the glass functioning as a bond member may be provided therebetween. In this case, the gaps between the sealing member 21 and the ceramic body 2 can be filled with the glass. As a result, the airtight property of the bonding portion can be improved.

As shown in FIGS. 6 and 7, the glass 13 functioning as the bond member has a surface extending from a part of the rear surface of the ceramic body 2 onto a part of the surface of the sealing member 21, and the surface of the glass 13 is a concave meniscus. In this case, it is understood that the glass 13 has good wettability to the surfaces of the sealing member 21 and the ceramic body 2 and the ceramic body 2 and that the bonding portion between the sealing member 21 and the ceramic body 2 has high airtightness. As a result, leak generation at the bonding portion can be prevented without fail.

ZnO—SiO$_2$—B$_2$O$_3$-based glass may be used as the glass 13, as in the first embodiment of the present invention. In addition, a material for forming the sealing member 21 may contain a material equivalent to that forming the tubular member 6. Furthermore, a material for forming the sealing member 21 may contain a material forming the ceramic body 2.

Figure 8:
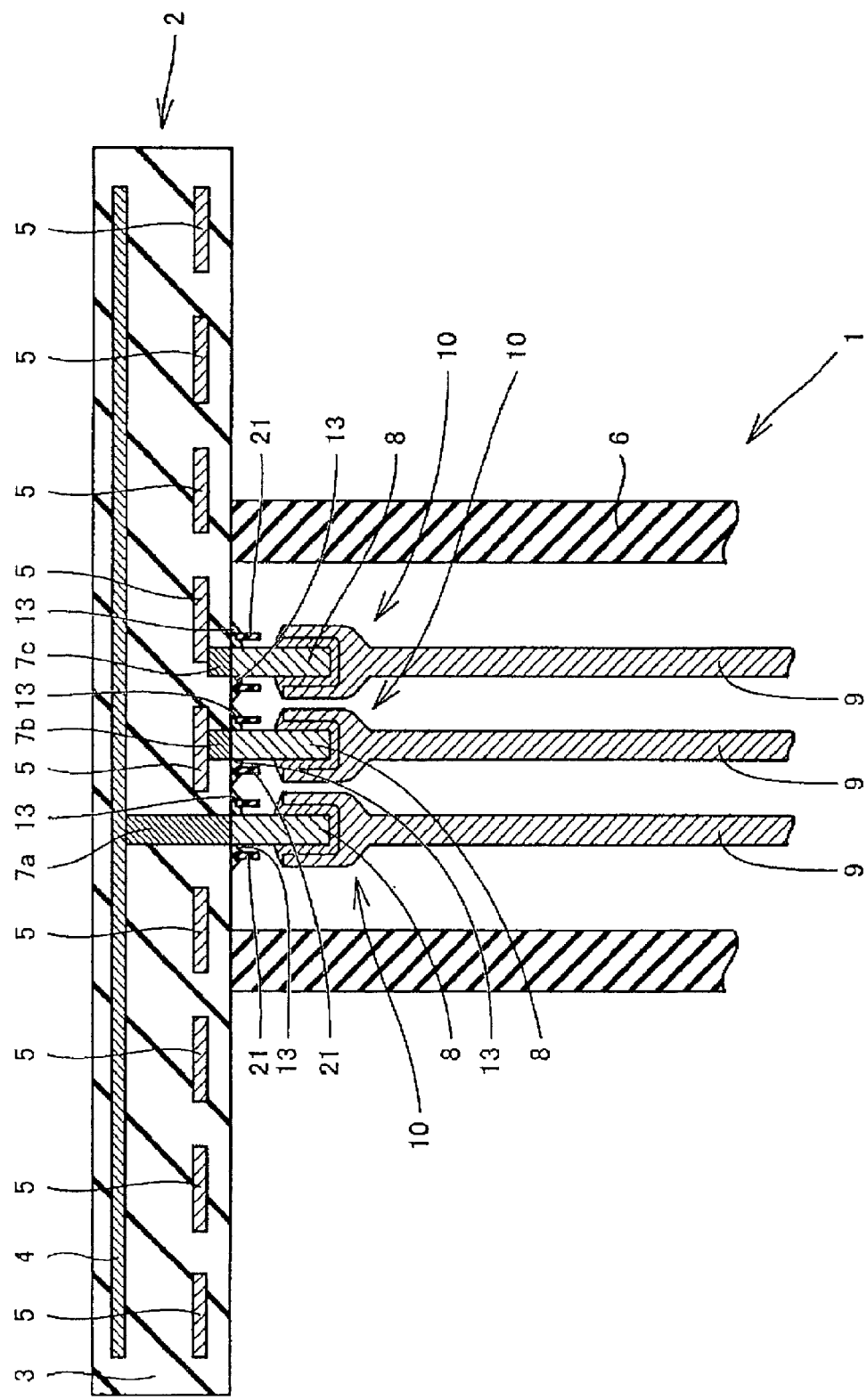
FIG. 8 is a schematic, cross-sectional view showing a first modified example of the workpiece holder shown in FIGS. 6 and 7 according to the fourth embodiment of the present invention.
Figure 9:
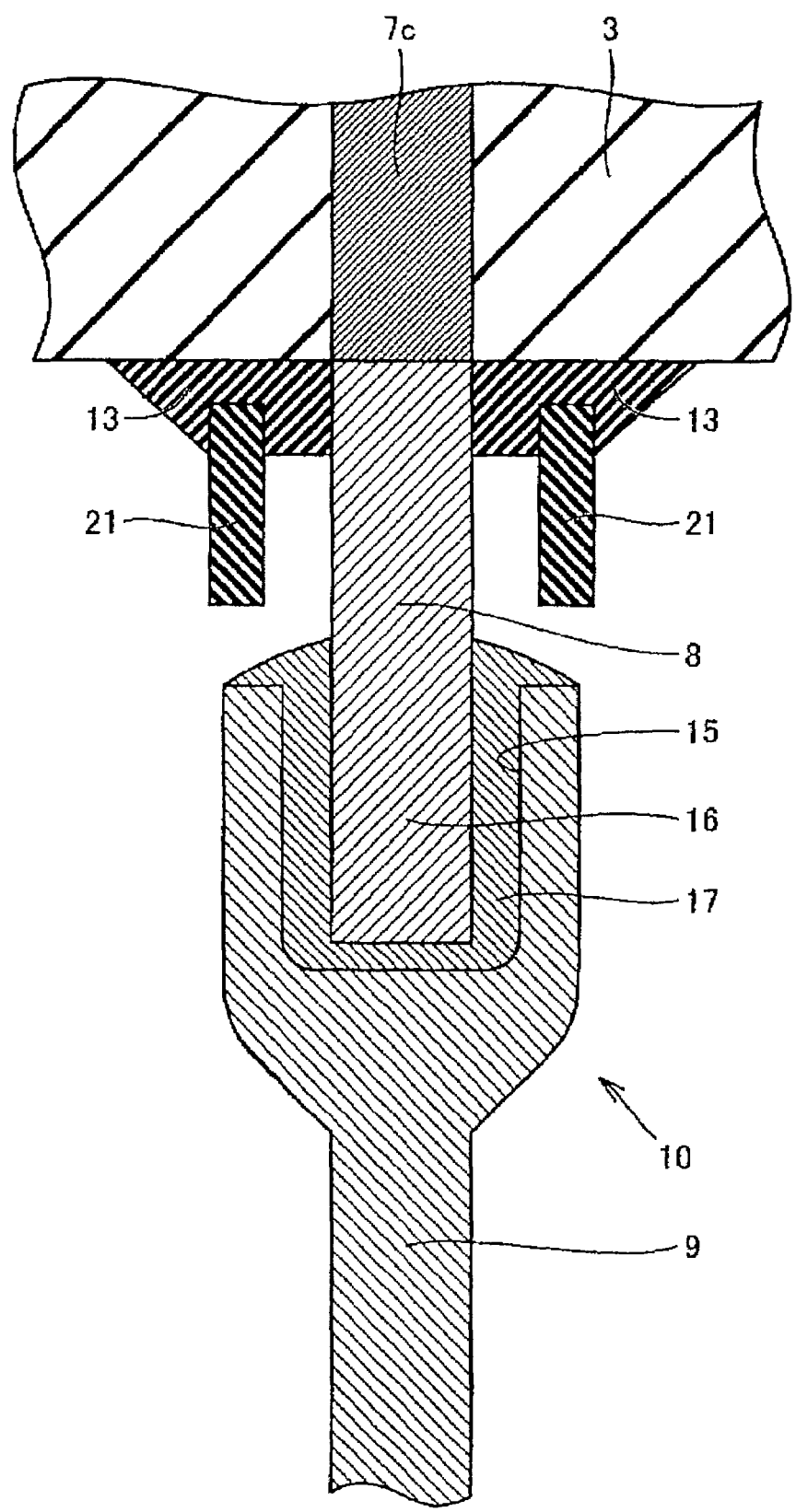
FIG. 9 is a schematic, cross-sectional view showing a part of the workpiece holder shown in FIG. 8.

FIG. 8 is a schematic, cross-sectional view showing a first modified example of the holder 1 shown in FIGS. 6 and 7 according to the fourth embodiment of the present invention. FIG. 9 is a schematic, cross-sectional view showing a part of the workpiece holder shown in FIG. 8. With reference to FIGS. 8 and 9, the first modified example of the holder according to the fourth embodiment of the present invention will be described.

As shown in FIGS. 8 and 9, the holder 1 used as a susceptor for a semiconductor manufacturing apparatus has the structure basically equivalent to that of the holder 1 shown in FIGS. 6 and 7 except that the shape of the glass 13 for bonding the sealing member 21 to the ceramic body 2 is different. That is, in the holder 1 shown in FIGS. 8 and 9, the glass 13 is provided between the sealing member 21 and the ceramic body 2. In addition, the glass 13 is disposed so as to surround and seal the connection portions between the terminal-side electrode lines 8 and the power supply terminals 7a to 7c. Furthermore, between the sealing member 21 and the terminal-side electrode line 8, there is a space in which the glass 13 is not provided. That is, between the sealing member 21 and the terminal-side electrode line 8, the glass 13 is only provided at the ceramic body 2 side. This structure can provide the same advantage as that of the holder 1 shown in FIGS. 6 and 7.

In heat treatment for fixing the glass 13 in the holder 1, a pressure is preferably applied to the glass 131 through the sealing member 21. In this case, a pressure of 100 g/cm$^2$ or more is preferably applied to the glass 13 from the sealing member 21 side. Accordingly, the number of minute gaps present at the interface between the glass 13 and the ceramic body 2, the sealing member 21, or the terminal-side electrode line 8 can be reduced or can be removed. As a result, the rate of helium leak from each of the regions in which the connection portions between the power supply terminals 7a to 7c and the terminal-side electrode lines 8 are located can be reduced, that is, the airtightness can be improved. In addition, when a pressure of 100 g/cm$^2$ or more is applied, the advantage approximately equivalent to that in the fourth embodiment can be obtained; however, when the pressure is less than 100 g/cm$^2$, a significant effect of decreasing the helium leak rate cannot be obtained.

Figure 10:
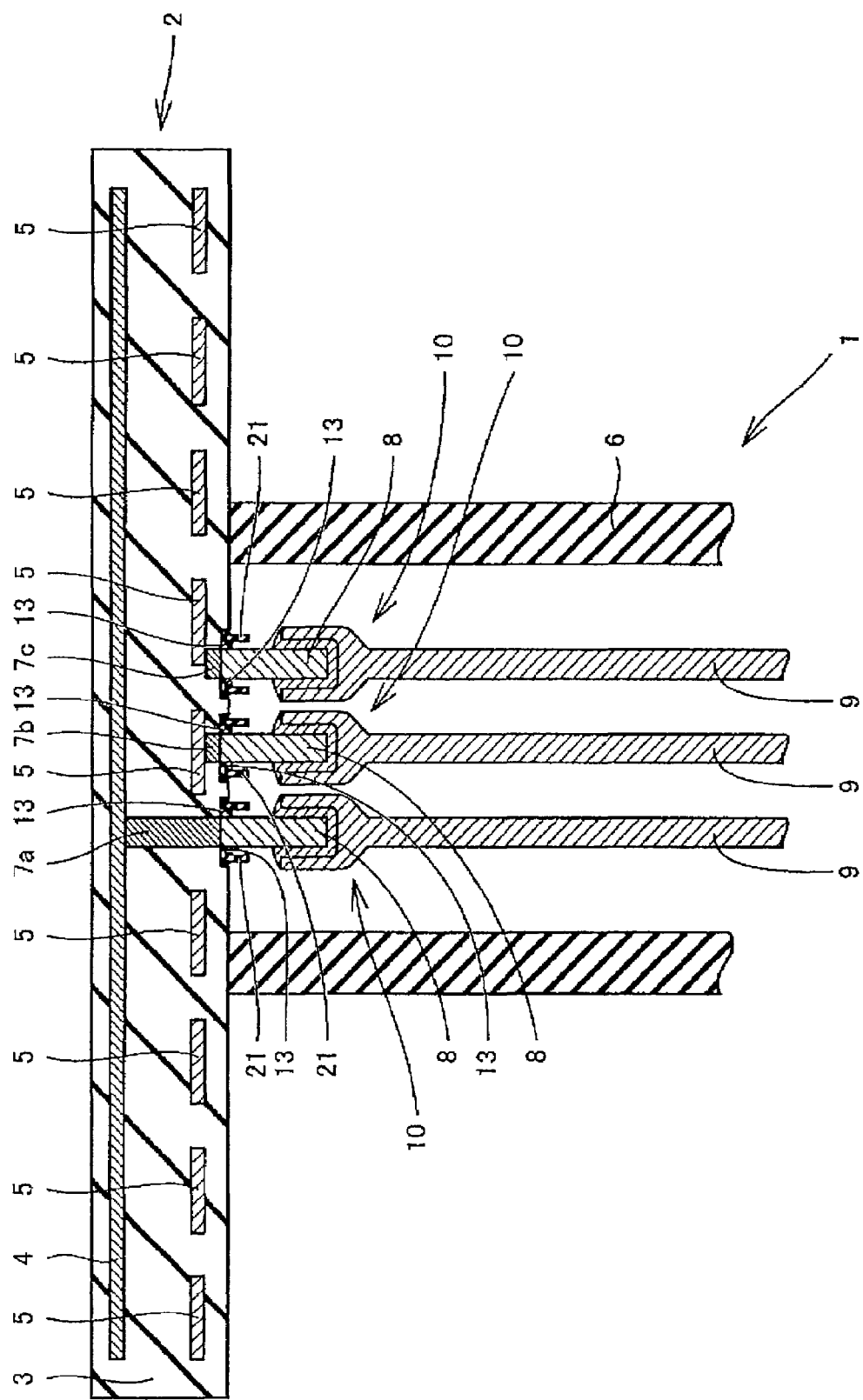
FIG. 10 is a schematic, cross-sectional view showing a second modified example of the workpiece holder shown in FIGS. 6 and 7 according to the fourth embodiment of the present invention.
Figure 11:
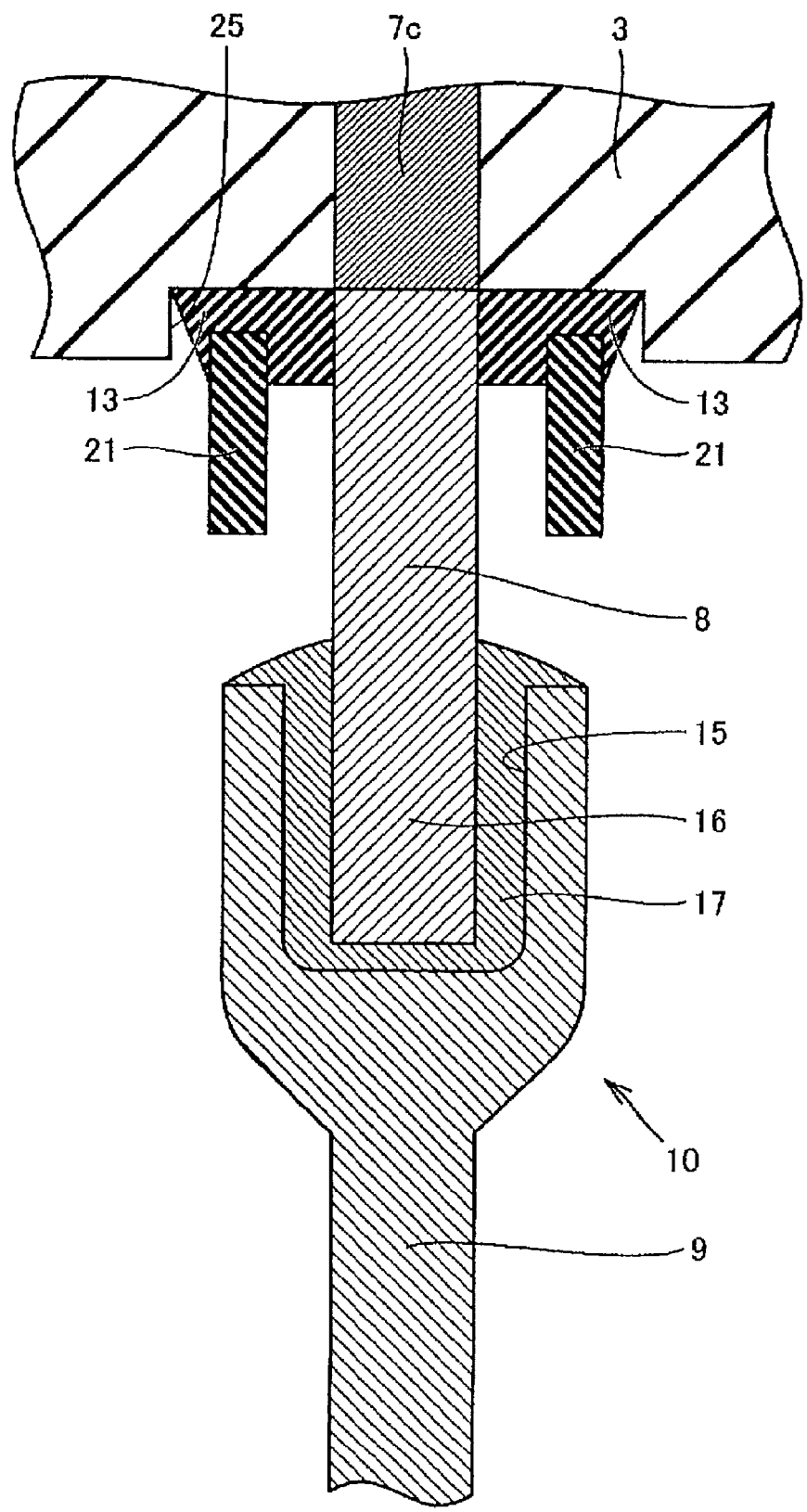
FIG. 11 is a schematic, cross-sectional view showing a part of the workpiece holder shown in FIG. 10.

FIG. 10 is a schematic, cross-sectional view showing a second modified example of the holder 1 shown in FIGS. 6 and 7 according to the fourth embodiment of the present invention. FIG. 11 is a schematic, cross-sectional view showing a part of the workpiece holder shown in FIG. 10. With reference to FIGS. 10 and 11, the second modified example of the holder according to the fourth embodiment of the present invention will be described.

As shown in FIGS. 10 and 11, the holder 1 used as a susceptor for a semiconductor manufacturing apparatus has the structure basically equivalent to that of the holder 1 shown in FIGS. 8 and 9 except that the shape of the surface of the ceramic body 2 is different. That is, in the holder 1 shown in FIG. 10, three grooves 25 (see FIG. 11) are formed in the rear surface side of the ceramic body 2. The shape of the groove 25 in plan view may be a circular or polygonal shape. In addition, at the bottom walls of the grooves 25, the power supply terminals 7a to 7c are exposed. The end surfaces of the power supply terminals 7a to 7c exposed at the bottom walls of the grooves 25 are connected to the corresponding terminal-side electrode lines 8. The sealing members 21 and the glass 13 are provided around the connection portions between the power supply terminals 7a to 7c and the terminal-side electrode lines 8, as is the holder 1 shown in FIGS. 8 and 9.

The structure thus formed provides the advantage equivalent to that of the holder 1 shown in FIGS. 8 and 9. In addition, since the connection portions between the power supply terminals 7a to 7c and the terminal-side electrode lines 8 are disposed inside the grooves 25, if any stress is applied to the terminal-side electrode lines 8 in the lateral direction (that is, when stress in the lateral direction is applied to the connection portions, for example), the stress is dispersedly applied not only to the bonding portions between the glass 13 and the bottom walls of the grooves 25 but also to the sidewalls of the grooves 25. Accordingly, the durability of the connection portions can be improved. In this case, the glass 13 or the sealing member 21 is preferably disposed so as to be in contact with the sidewalls of the groove 25. With such structure, since the glass 13 or the sealing member 21 is supported by the sidewalls of the groove 25, the durability of the connection portion against an external force can be effectively improved.

In the embodiments described above of the present invention, the connection portions between the power supply terminals 7a to 7c and the terminal-side electrode lines 8 may have a screw-in structure. For example, a thread part may be formed at an end portion of each of the power supply terminals 7a to 7c, and a threaded hole may be formed at the upper portion (opposing each of the power supply terminals 7a to 7c) of each of the terminal-side electrode lines 8. Subsequently, by inserting the thread part into the threaded hole and fixing together, the terminal-side electrode lines 8 and the corresponding power supply terminals 7a to 7c may be connected to each other.

EXAMPLES

In order to prove the advantage of the holder according to the present invention, the following experiments were carried out.

First, four types of powdered starting materials having the compositions shown in Table I were prepared.

TABLE I

| No. | Mass ratio |
| --- | --- |
| Composition 1 | $AlN:Y_2O_3 = 100:5$ |
| Composition 2 | $AlN:Y_2O_3 = 100:0.5$ |
| Composition 3 | $Al_2O_3:CaO:MgO = 100:0.2:0.2$ |
| Composition 4 | $AlN:CaO = 100:2.0$ |

To each of the starting materials having the compositions shown in the above Table I, a binder and a solvent were added, and subsequently, mixing was performed using a ball mill, so that slurries having compositions (compositions 1 to 4) were formed.

Next, the individual slurries having compositions 1 to 4 shown in Table I were formed into sheets by a doctor blade method. The sheets (green sheets) thus formed were cut into a circular shape so as to have a diameter of 350 mm after sintering was performed. Subsequently, a paste containing tungsten (W) was applied to the circular sheets thus formed by a screen printing method, thereby forming a heater circuit.

Next, a plurality of sheets, which were not provided with heater circuits, was laminated on the surface on which the heater circuit described above was formed. In addition, on the surface of this laminate, a sheet having a plasma-forming (RF) electrode or an electrostatic electrode (electrostatic chucking), which was formed by applying a paste containing tungsten by a screen printing method, was laminated. Thus, a laminate made of the sheets was formed.

The laminate sheets thus formed were degreased by heat treatment at a heating temperature of 700° C. in a nitrogen atmosphere.

Next, the laminates using slurries having compositions 1, 2, and 4 were sintered at a heating temperature of 1,800° C. in a nitrogen atmosphere. The laminate made of a slurry having composition 3 was sintered at a heating temperature of 1,600° C. in a nitrogen atmosphere. Subsequently, power supply terminals for supplying current to the heater circuit and the electrostatic electrode or the plasma-forming electrode were formed at predetermined positions. Thus, ceramic bodies composed of the compositions described above were formed.

Next, each of the slurries having compositions 1 to 4 shown in Table I was formed into pellets by a spray dry method. By using the pellets as starting material, cylindrical molded bodies were formed by a dry press method. These molded bodies were degreased at a heating temperature of 700° C. in a nitrogen stream. Subsequently, sintering treatment was performed under the same conditions as those for the above-described sintering of the ceramic bodies having the compositions 1 to 4, respectively.

After the above sintering treatment was performed, machining was performed for the cylindrical sintered bodies thus formed. As a result, tubular members 50 mm in inside diameter, 60 mm in outside diameter, and 200 mm long were obtained.

In addition to those tubular members, tubular members having a structure different from that of the tubular members described above were formed by steps equivalent to those described above. On the inside wall of these tubular members, a protruding portion for holding the sealing member was provided at a distance of 30 mm from the bonding portion (end of the tubular member) to be bonded with a ceramic body. The protruding portion functioning as a holding part was 5 mm high (height from the inside wall of the tubular member) and 40 mm in inside diameter.

Slurry made of $Al_2O_3$—$Y_2O_3$—AlN was applied to an end surface of the tubular member. The tubular members and the ceramic bodies were joined together with the slurry coated surface in contact with the rear surface of the ceramic bodies, and the joint bodies thus formed were subjected to heat treatment under the same conditions as those of the process for sintering the ceramic bodies. As a result, each ceramic body and each tubular member were bonded together. In each joint body, the end of the respective power supply terminals for supplying electrical power from the outside to a heater circuit, the electrostatic electrode, and the plasma-forming electrode, which were embedded inside the ceramic body, was exposed at a surface area that was located inside the tubular member.

Next, the terminal-side electrode lines used as power supply members were connected to the power supply terminals for the heater circuit, the electrostatic electrode, and the plasma-forming electrode. Through these electrode lines, current could be supplied to the heater circuit, the electrostatic electrode, and the plasma-forming electrode.

In addition, the sheets having the compositions 1 to 4 respectively were cut into a predetermined size, and subsequently, they were subjected to heat treatment to become a sintered bodies as in the case of forming the ceramic bodies. The sintered bodies may be formed by laminating a plurality of sheets, if necessary, to have a predetermined thickness. Next, the sintered body thus formed were subjected to machining so as to form opening portions therein for the terminal-side electrode lines to penetrate. In addition, the laminated bodies were subjected to machining to adjust their peripheral dimensions so that they could be inserted inside the tubular member. Thus, the sealing members were formed. In addition, another type of sealing members, which were used for each connection portion between the terminal-side electrode line and the electrical circuit as described in the fourth embodiment of the present invention, were formed in a similar manner.

Subsequently, after each ceramic body was provided with the tubular member, the power supply terminals, and the electrode lines functioning as the power supply members, the sealing members were each inserted inside the tubular member. Alternatively, a joint body may be formed by fixing the sealing member to the inside of the tubular member, and then the joint body may be bonded to the ceramic body. In addition, the above-mentioned another type of sealing members was provided on the ceramic body so as to surround each connection portion of the terminal-side electrode line.

Subsequently, glass was applied between the tubular member and the sealing member, and between the electrode line and the sealing member, respectively. The sealing members were respectively fixed by firing treatment at a temperature of 700° C. in a nitrogen atmosphere, in an argon atmosphere, in an evacuated atmosphere, or in the air such that the region surrounded by the sealing member, the tubular member, and the ceramic body was sealed. In addition, on the sample having the above-mentioned another type of sealing members, glass was applied between the sealing members and the ceramic body and between the electrode line and the sealing member, respectively, and thereafter heat treatment (firing treatment) was performed in a manner similar to that described above. In some samples, the heat treatment was performed while a pressure of 100 g/cm$^2$ or more was applied to the glass through the sealing member. Thus, the sealing members were respectively fixed, and each region surrounded by the sealing member and the ceramic body was sealed. The glass used for sealing in these examples was $ZnO$—$SiO_2$—$B_2O_3$ crystallized glass.

According to the methods described above, 68 samples shown in Tables II to VI were prepared. In addition, in order to prove the influence of pressure applied during firing treatment of the glass, 39 samples (sample Nos. 69 to 107) shown in Tables VII to IX were prepared. Tables II to IX show the conditions for fabricating the samples used in the following tests and the evaluation results thereof.

TABLE II

| Sample No. | Type | Material for ceramic body | Material for tubular member | Material for sealing member | Sealing | Sealing atmosphere | Material for electrode line | Formation of meniscus | Leak rate (Pa · m$^3$/s) | Oxidation resistance (750° C. in the air) |
|---|---|---|---|---|---|---|---|---|---|---|
| 1 | Example | Composition 1 | Composition 1 | Composition 1 | Space | $N_2$ | Kovar | Yes | $10^{-8}$ or less | Good |
| 2 | Example | Composition 1 | Composition 1 | Composition 1 | Space | Ar | Kovar | Yes | $10^{-8}$ or less | Good |
| 3 | Example | Composition 1 | Composition 1 | Composition 1 | Space | Vacuum | Kovar | Yes | $10^{-8}$ or less | Good |
| 4 | Comparative example | Composition 1 | Composition 1 | Composition 1 | Space | Air | Kovar | No | Not sealable (Oxidation of power supply terminal) | |
| 5 | Comparative example | Composition 1 | Composition 1 | Composition 3 | Space | $N_2$ | Kovar | No | Not sealable (Oxidation of power supply terminal) | |
| 6 | Comparative example | Composition 1 | Composition 1 | Composition 1 | Space | $N_2$ | Ni | No | Not sealable (Glass breakage) | |
| 7 | Example | Composition 1 | Composition 1 | Composition 2 | Space | $N_2$ | Kovar | Yes | $10^{-8}$ or less | Good |
| 8 | Example | Composition 1 | Composition 1 | Composition 4 | Space | $N_2$ | Kovar | Yes | $10^{-8}$ or less | Good |
| 9 | Example | Composition 2 | Composition 2 | Composition 1 | Space | $N_2$ | Kovar | Yes | $10^{-8}$ or less | Good |
| 10 | Example | Composition 3 | Composition 3 | Composition 3 | Space | $N_2$ | Kovar | Yes | $10^{-8}$ or less | Good |
| 11 | Comparative example | Composition 3 | Composition 3 | Composition 1 | Space | $N_2$ | Kovar | No | Not sealable (Glass breakage) | |
| 12 | Example | Composition 1 | Composition 2 | Composition 4 | Space | $N_2$ | Kovar | Yes | $10^{-8}$ or less | Good |
| 13 | Example | Composition 1 | Composition 1 | Composition 1 | Contact | $N_2$ | Kovar | Yes | $10^{-8}$ or less | Good |
| 14 | Example | Composition 1 | Composition 1 | Composition 1 | Contact | Ar | Kovar | Yes | $10^{-8}$ or less | Good |
| 15 | Example | Composition 1 | Composition 1 | Composition 1 | Contact | Vacuum | Kovar | Yes | $10^{-8}$ or less | Good |

TABLE III

| Sample No. | Type | Material for ceramic body | Material for tubular member | Material for sealing member | Sealing | Sealing atmosphere | Material for electrode line | Formation of meniscus | Leak rate (Pa · m$^3$/s) | Oxidation resistance (750° C. in the air) |
|---|---|---|---|---|---|---|---|---|---|---|
| 16 | Comparative example | Composition 1 | Composition 1 | Composition 1 | Contact | Air | Kovar | No | Not sealable (Oxidation of power supply terminal) | |
| 17 | Comparative example | Composition 1 | Composition 1 | Composition 3 | Contact | $N_2$ | Kovar | No | Not sealable (Oxidation of power supply terminal) | |

TABLE III-continued

| Sample No. | Type | Material for ceramic body | Material for tubular member | Material for sealing member | Sealing | Sealing atmosphere | Material for electrode line | Formation of meniscus | Leak rate (Pa · m$^3$/s) | Oxidation resistance (750° C. in the air) |
|---|---|---|---|---|---|---|---|---|---|---|
| 18 | Comparative example | Composition 1 | Composition 1 | Composition 1 | Contact | N$_2$ | Ni | No | Not sealable (Glass breakage) | |
| 19 | Example | Composition 1 | Composition 1 | Composition 2 | Contact | N$_2$ | Kovar | Yes | 10$^{-8}$ or less | Good |
| 20 | Example | Composition 1 | Composition 1 | Composition 4 | Contact | N$_2$ | Kovar | Yes | 10$^{-8}$ or less | Good |
| 21 | Example | Composition 2 | Composition 2 | Composition 1 | Contact | N$_2$ | Ni | Yes | 10$^{-8}$ or less | Good |
| 22 | Example | Composition 3 | Composition 3 | Composition 3 | Contact | N$_2$ | Kovar | Yes | 10$^{-8}$ or less | Good |
| 23 | Comparative example | Composition 3 | Composition 3 | Composition 1 | Contact | N | Kovar | No | Not sealable (Glass breakage) | |
| 24 | Example | Composition 1 | Composition 2 | Composition 4 | Contact | N$_2$ | Kovar | Yes | 10$^{-8}$ or less | Good |

TABLE IV

| Sample No. | Type | Material for ceramic body | Material for tubular member | Material for sealing member | Sealing | Sealing atmosphere | Material for electrode line | Formation of meniscus | Leak rate (Pa · m$^3$/s) | Oxidation resistance (750° C. in the air) |
|---|---|---|---|---|---|---|---|---|---|---|
| 25 | Example | Composition 1 | Composition 1 | Composition 1 | Individual | N$_2$ | Kovar | Yes | 10$^{-8}$ or less | Good |
| 26 | Example | Composition 1 | Composition 1 | Composition 1 | Individual | Ar | Kovar | Yes | 10$^{-8}$ or less | Good |
| 27 | Example | Composition 1 | Composition 1 | Composition 1 | Individual | Vacuum | Kovar | Yes | 10$^{-8}$ or less | Good |
| 28 | Comparative example | Composition 1 | Composition 1 | Composition 1 | Individual | Air | Kovar | No | Not sealable | |
| 29 | Example | Composition 1 | Composition 1 | Composition 3 | Individual | N$_2$ | Kovar | Yes | 10$^{-8}$ or less | Good |
| 30 | Comparative example | Composition 1 | Composition 1 | Composition 1 | Individual | N$_2$ | Ni | No | Not sealable | |
| 31 | Example | Composition 1 | Composition 1 | Composition 2 | Individual | N$_2$ | Kovar | Yes | 10$^{-8}$ or less | Good |
| 32 | Example | Composition 1 | Composition 1 | Composition 4 | Individual | N$_2$ | Kovar | Yes | 10$^{-8}$ or less | Good |
| 33 | Example | Composition 2 | Composition 2 | Composition 1 | Individual | N$_2$ | Kovar | Yes | 10$^{-8}$ or less | Good |
| 34 | Example | Composition 3 | Composition 3 | Composition 3 | Individual | N$_2$ | Kovar | Yes | 10$^{-8}$ or less | Good |
| 35 | Comparative example | Composition 3 | Composition 3 | Composition 1 | Individual | N$_2$ | Kovar | No | Not sealable | |
| 36 | Example | Composition 1 | Composition 2 | Composition 4 | Individual | N$_2$ | Kovar | Yes | 10$^{-8}$ or less | Good |

TABLE V

| Sample No. | Type | Material for ceramic body | Material for tubular member | Material for sealing member | Sealing | Sealing atmosphere | Material for electrode line | Formation of meniscus | Leak rate (Pa · m$^3$/s) | Oxidation resistance (750° C. in the air) |
|---|---|---|---|---|---|---|---|---|---|---|
| 37 | Comparative example | Composition 1 | Composition 1 | Composition 1 | Space | N$_2$ | W (No plating) | Yes | 10$^{-8}$ or less | Oxidized |
| 38 | Example | Composition 1 | Composition 1 | Composition 1 | Space | N$_2$ | W-1 | Yes | 10$^{-8}$ or less | Good |
| 39 | Example | Composition 1 | Composition 1 | Composition 1 | Space | Vacuum | W-2 | Yes | 10$^{-8}$ or less | Good |
| 40 | Example | Composition 1 | Composition 1 | Composition 1 | Space | N$_2$ | W-3 | Yes | 10$^{-8}$ or less | Good |
| 41 | Comparative example | Composition 1 | Composition 1 | Composition 1 | Space | N$_2$ | Cu-W (No plating) | Yes | 10$^{-8}$ or less | Oxidized |
| 42 | Example | Composition 1 | Composition 1 | Composition 1 | Space | N$_2$ | Cu-W-1 | Yes | 10$^{-8}$ or less | Good |
| 43 | Example | Composition 1 | Composition 1 | Composition 1 | Space | N$_2$ | Cu-W-2 | Yes | 10$^{-8}$ or less | Good |
| 44 | Example | Composition 1 | Composition 1 | Composition 1 | Space | N$_2$ | Cu-W-3 | Yes | 10$^{-8}$ or less | Good |
| 45 | Comparative example | Composition 1 | Composition 1 | Composition 1 | Space | N$_2$ | Mo (No plating) | Yes | 10$^{-8}$ or less | Oxidized |
| 46 | Example | Composition 1 | Composition 1 | Composition 1 | Space | N$_2$ | Mo-1 | Yes | 10$^{-8}$ or less | Good |
| 47 | Example | Composition 1 | Composition 1 | Composition 1 | Space | N$_2$ | Mo-2 | Yes | 10$^{-8}$ or less | Good |
| 48 | Example | Composition 1 | Composition 1 | Composition 1 | Space | N$_2$ | Mo-3 | Yes | 10$^{-8}$ or less | Good |

TABLE V-continued

| Sample No. | Type | Material for ceramic body | Material for tubular member | Material for sealing member | Sealing | Sealing atmosphere | Material for electrode line | Formation of meniscus | Leak rate (Pa · m³/s) | Oxidation resistance (750° C. in the air) |
|---|---|---|---|---|---|---|---|---|---|---|
| 49 | Comparative example | Composition 1 | Composition 1 | Composition 1 | Space | $N_2$ | Cu-Mo (No plating) | Yes | $10^{-8}$ or less | Oxidized |
| 50 | Example | Composition 1 | Composition 1 | Composition 1 | Space | $N_2$ | Cu-Mo-1 | Yes | $10^{-8}$ or less | Good |
| 51 | Example | Composition 1 | Composition 1 | Composition 1 | Space | $N_2$ | Cu-Mo-2 | Yes | $10^{-8}$ or less | Good |
| 52 | Example | Composition 1 | Composition 1 | Composition 1 | Space | $N_2$ | Cu-Mo-3 | Yes | $10^{-8}$ or less | Good |

TABLE VI

| Sample No. | Type | Material for ceramic body | Material for tubular member | Material for sealing member | Sealing | Sealing atmosphere | Material for electrode line | Formation of meniscus | Leak rate (Pa · m³/s) | Oxidation resistance (750° C. in the air) |
|---|---|---|---|---|---|---|---|---|---|---|
| 53 | Comparative example | Composition 1 | Composition 1 | Composition 1 | Contact | $N_2$ | W (No plating) | Yes | $10^{-8}$ or less | Oxidized |
| 54 | Example | Composition 1 | Composition 1 | Composition 1 | Contact | $N_2$ | W-1 | Yes | $10^{-8}$ or less | Good |
| 55 | Example | Composition 1 | Composition 1 | Composition 1 | Contact | Vacuum | W-2 | Yes | $10^{-8}$ or less | Good |
| 56 | Example | Composition 1 | Composition 1 | Composition 1 | Contact | $N_2$ | W-3 | Yes | $10^{-8}$ or less | Good |
| 57 | Comparative example | Composition 1 | Composition 1 | Composition 1 | Space | $N_2$ | Cu-W (No plating) | Yes | $10^{-8}$ or less | Oxidized |
| 58 | Example | Composition 1 | Composition 1 | Composition 1 | Space | $N_2$ | Cu-W-1 | Yes | $10^{-8}$ or less | Good |
| 59 | Example | Composition 1 | Composition 1 | Composition 1 | Space | $N_2$ | Cu-W-2 | Yes | $10^{-8}$ or less | Good |
| 60 | Example | Composition 1 | Composition 1 | Composition 1 | Space | $N_2$ | Cu-W-3 | Yes | $10^{-8}$ or less | Good |
| 61 | Comparative example | Composition 1 | Composition 1 | Composition 1 | Space | $N_2$ | Mo (No plating) | Yes | $10^{-8}$ or less | Oxidized |
| 62 | Example | Composition 1 | Composition 1 | Composition 1 | Space | $N_2$ | Mo-1 | Yes | $10^{-8}$ or less | Good |
| 63 | Example | Composition 1 | Composition 1 | Composition 1 | Space | $N_2$ | Mo-2 | Yes | $10^{-8}$ or less | Good |
| 64 | Example | Composition 1 | Composition 1 | Composition 1 | Space | $N_2$ | Mo-3 | Yes | $10^{-8}$ or less | Good |
| 65 | Comparative example | Composition 1 | Composition 1 | Composition 1 | Space | $N_2$ | Cu-Mo (No plating) | Yes | $10^{-8}$ or less | Oxidized |
| 66 | Example | Composition 1 | Composition 1 | Composition 1 | Space | $N_2$ | Cu-Mo-1 | Yes | $10^{-8}$ or less | Good |
| 67 | Example | Composition 1 | Composition 1 | Composition 1 | Space | $N_2$ | Cu-Mo-2 | Yes | $10^{-8}$ or less | Good |
| 68 | Example | Composition 1 | Composition 1 | Composition 1 | Space | $N_2$ | Cu-Mo-3 | Yes | $10^{-8}$ or less | Good |

TABLE VII

| Sample No. | Type | Material for ceramic body | Material for tubular member | Material for sealing member | Sealing | Sealing atmosphere | Material for electrode line | Load for sealing | Leak rate (Pa · m³/s) | Oxidation resistance (750° C. in the air) |
|---|---|---|---|---|---|---|---|---|---|---|
| 69 | Example | Composition 1 | Composition 1 | Composition 1 | Contact with glass (FIG. 8) | $N_2$ | Kovar | No | $10^{-8}$ or less | Good |
| 70 | Comparative example | Composition 1 | Composition 1 | Composition 1 | Contact with glass (FIG. 8) | $N_2$ | W | No | $10^{-8}$ or less | No good |
| 71 | Example | Composition 1 | Composition 1 | Composition 1 | Contact with glass (FIG. 8) | $N_2$ | W-1 | No | $10^{-8}$ or less | Good |
| 72 | Example | Composition 1 | Composition 1 | Composition 1 | Contact with glass (FIG. 8) | $N_2$ | W-1 | 100 g/cm² | $10^{-8}$ or less | Good |
| 73 | Example | Composition 1 | Composition 1 | Composition 1 | Contact with glass (FIG. 8) | $N_2$ | W-2 | No | $10^{-8}$ or less | Good |
| 74 | Example | Composition 1 | Composition 1 | Composition 1 | Contact with glass (FIG. 8) | $N_2$ | W-2 | 100 g/cm² | $10^{-8}$ or less | Good |

TABLE VII-continued

| Sample No. | Type | Material for ceramic body | Material for tubular member | Material for sealing member | Sealing | Sealing atmosphere | Material for electrode line | Load for sealing | Leak rate (Pa · m$^3$/s) | Oxidation resistance (750° C. in the air) |
|---|---|---|---|---|---|---|---|---|---|---|
| 75 | Example | Composition 1 | Composition 1 | Composition 1 | Contact with glass (FIG. 8) | N$_2$ | W-3 | No | 10$^{-8}$ or less | Good |
| 76 | Example | Composition 1 | Composition 1 | Composition 1 | Contact with glass (FIG. 8) | N$_2$ | W-3 | 100 g/cm$^2$ | 10$^{-8}$ or less | Good |
| 77 | Comparative example | Composition 1 | Composition 1 | Composition 1 | Contact with glass (FIG. 8) | N$_2$ | Mo | No | 10$^{-8}$ or less | No good |
| 78 | Example | Composition 1 | Composition 1 | Composition 1 | Contact with glass (FIG. 8) | N$_2$ | Mo-1 | No | 10$^{-8}$ or less | Good |
| 79 | Example | Composition 1 | Composition 1 | Composition 1 | Contact with glass (FIG. 8) | N$_2$ | Mo-1 | 100 g/cm$^2$ | 10$^{-8}$ or less | Good |
| 80 | Example | Composition 1 | Composition 1 | Composition 1 | Contact with glass (FIG. 8) | N$_2$ | Mo-2 | No | 10$^{-8}$ or less | Good |
| 81 | Example | Composition 1 | Composition 1 | Composition 1 | Contact with glass (FIG. 8) | N$_2$ | Mo-2 | 100 g/cm$^2$ | 10$^{-8}$ or less | Good |
| 82 | Example | Composition 1 | Composition 1 | Composition 1 | Contact with glass (FIG. 8) | N$_2$ | Mo-3 | No | 10$^{-8}$ or less | Good |
| 83 | Example | Composition 1 | Composition 1 | Composition 1 | Contact with glass (FIG. 8) | N$_2$ | Mo-3 | 100 g/cm$^2$ | 10$^{-8}$ or less | Good |
| 84 | Comparative example | Composition 1 | Composition 1 | Composition 1 | Contact with glass (FIG. 8) | N$_2$ | Cu-W | No | 10$^{-8}$ or less | No good |

TABLE VIII

| Sample No. | Type | Material for ceramic body | Material for tubular member | Material for sealing member | Sealing | Sealing atmosphere | Material for electrode line | Load for sealing | Leak rate (Pa · m$^3$/s) | Oxidation resistance (750° C. in the air) |
|---|---|---|---|---|---|---|---|---|---|---|
| 85 | Example | Composition 1 | Composition 1 | Composition 1 | Contact with glass (FIG. 8) | N$_2$ | Cu-W-1 | No | 10$^{-8}$ or less | Good |
| 86 | Example | Composition 1 | Composition 1 | Composition 1 | Contact with glass (FIG. 8) | N$_2$ | Cu-W-1 | 100 g/cm$^2$ | 10$^{-8}$ or less | Good |
| 87 | Example | Composition 1 | Composition 1 | Composition 1 | Contact with glass (FIG. 8) | N$_2$ | Cu-W-2 | No | 10$^{-8}$ or less | Good |
| 88 | Example | Composition 1 | Composition 1 | Composition 1 | Contact with glass (FIG. 8) | N$_2$ | Cu-W-2 | 100 g/cm$^2$ | 10$^{-8}$ or less | Good |
| 89 | Example | Composition 1 | Composition 1 | Composition 1 | Contact with glass (FIG. 8) | N$_2$ | Cu-W-3 | No | 10$^{-8}$ or less | Good |

TABLE VIII-continued

| Sample No. | Type | Material for ceramic body | Material for tubular member | Material for sealing member | Sealing | Sealing atmosphere | Material for electrode line | Load for sealing | Leak rate (Pa · m$^3$/s) | Oxidation resistance (750° C. in the air) |
|---|---|---|---|---|---|---|---|---|---|---|
| 90 | Example | Composition 1 | Composition 1 | Composition 1 | Contact with glass (FIG. 8) | N$_2$ | Cu-W-3 | 100 g/cm$^2$ | 10$^{-8}$ or less | Good |
| 91 | Comparative example | Composition 1 | Composition 1 | Composition 1 | Contact with glass (FIG. 8) | N$_2$ | Cu-Mo | No | 10$^{-8}$ or less | No good |
| 92 | Example | Composition 1 | Composition 1 | Composition 1 | Contact with glass (FIG. 8) | N$_2$ | Cu-Mo-1 | No | 10$^{-8}$ or less | Good |
| 93 | Example | Composition 1 | Composition 1 | Composition 1 | Contact with glass (FIG. 8) | N$_2$ | Cu-Mo-1 | 100 g/cm$^2$ | 10$^{-8}$ or less | Good |
| 94 | Example | Composition 1 | Composition 1 | Composition 1 | Contact with glass (FIG. 8) | N$_2$ | Cu-Mo-2 | No | 10$^{-8}$ or less | Good |
| 95 | Example | Composition 1 | Composition 1 | Composition 1 | Contact with glass (FIG. 8) | N$_2$ | Cu-Mo-2 | 100 g/cm$^2$ | 10$^{-8}$ or less | Good |
| 96 | Example | Composition 1 | Composition 1 | Composition 1 | Contact with glass (FIG. 8) | N$_2$ | Cu-Mo-3 | No | 10$^{-8}$ or less | Good |
| 97 | Example | Composition 1 | Composition 1 | Composition 1 | Contact with glass (FIG. 8) | N$_2$ | Cu-MO-3 | 100 g/cm$^2$ | 10$^{-8}$ or less | Good |
| 98 | Example | Composition 1 | Composition 1 | Composition 1 | Contact with glass (FIG. 8) | N$_2$ | Kovar | 100 g/cm$^2$ | 10$^{-8}$ or less | Good |
| 99 | Example | Composition 1 | Composition 1 | Composition 1 | Contact with glass (FIG. 8) | Argon | Kovar | No | 10$^{-8}$ or less | Good |
| 100 | Example | Composition 1 | Composition 1 | Composition 1 | Contact with glass (FIG. 8) | Argon | Kovar | 100 g/cm$^2$ | 10$^{-8}$ or less | Good |

TABLE IX

| Sample No. | Type | Material for ceramic body | Material for tubular member | Material for sealing member | Sealing | Sealing atmosphere | Material for electrode line | Load for sealing | Leak rate (Pa · m$^3$/s) | Oxidation resistance (750° C. in the air) |
|---|---|---|---|---|---|---|---|---|---|---|
| 101 | Example | Composition 1 | Composition 1 | Composition 1 | Contact with glass (FIG. 8) | Vacuum | Kovar | No | 10$^{-8}$ or less | Good |
| 102 | Example | Composition 1 | Composition 1 | Composition 2 | Contact with glass (FIG. 8) | N$_2$ | Kovar | No | 10$^{-8}$ or less | Good |
| 103 | Example | Composition 1 | Composition 1 | Composition 4 | Contact with glass (FIG. 8) | N$_2$ | Kovar | No | 10$^{-8}$ or less | Good |
| 104 | Example | Composition 2 | Composition 2 | Composition 1 | Contact with glass (FIG. 8) | N$_2$ | Kovar | No | 10$^{-8}$ or less | Good |

TABLE IX-continued

| Sample No. | Type | Material for ceramic body | Material for tubular member | Material for sealing member | Sealing | Sealing atmosphere | Material for electrode line | Load for sealing | Leak rate (Pa · m³/s) | Oxidation resistance (750° C. in the air) |
|---|---|---|---|---|---|---|---|---|---|---|
| 105 | Example | Composition 3 | Composition 3 | Composition 3 | Contact with glass (FIG. 8) | $N_2$ | Kovar | No | $10^{-8}$ or less | Good |
| 106 | Comparative example | Composition 3 | Composition 3 | Composition 1 | Contact with glass (FIG. 8) | $N_2$ | Kovar | No | Not sealable (Glass breakage) | |
| 107 | Example | Composition 1 | Composition 2 | Composition 4 | Contact with glass (FIG. 8) | $N_2$ | Kovar | No | $10^{-8}$ or less | Good |

In the column "material for electrode line" in the tables, Cu—W means a copper (Cu)-tungsten (W) alloy. In the column "material for electrode line" in Table V, "W-1" for sample No. 38 means that the electrode line was made of tungsten (W) base material having a nickel (Ni) plating layer of 2 μm thick (hereinafter referred to as "first plating layer"). "W-2" for sample No. 39 in the column "material for electrode line" means that a tungsten (W) base material having a gold (Au) plating layer of 1 μm thick (hereinafter referred to as "second plating layer") as a coating layer was used for the electrode line. "W-3" for sample No. 40 in the column "material for electrode line" means that a tungsten (W) base material having a nickel (Ni) layer of 2 μm thick and a gold (Au) layer of 1 μm thick plated thereon in that order (hereinafter referred to as "third plating layer") was used for the electrode line.

"Cu—W-1", "Cu—W-2", and "Cu—W-3" for sample Nos. 42 to 44 in the column "material for electrode line" mean that the electrode lines were each made of a Cu—W alloy base material having a plating of the first, second, and the third plating layers, respectively. "Mo-1" to "Mo-3" for sample Nos. 46 to 48 in the column "material for electrode line" mean that the electrode lines were each formed of a molybdenum (Mo) base material having a plating of the first to the third plating layers, respectively. In the column, "sealing" in Tables VII to IX, the term "contact with glass (FIG. 8)" means that the type of sealing using in the holder shown in FIG. 8 was employed.

In order to determine heat resistance and oxidation resistance of the holders, each sample was subjected to heat treatment at 750° C. for 1,000 hours in the air. Subsequently, each sample was evaluated with respect to oxidization at the connection portions (power supply terminals or the like) between the electrode line and the heater circuit or the like by measuring circuit resistance of the heater circuit, etc. after the heat treatment. As a result, it was confirmed that the samples of the holders formed according to the embodiments of the present invention had sufficient oxidation resistance as shown in FIGS. 2 to 9.

Figure 12:
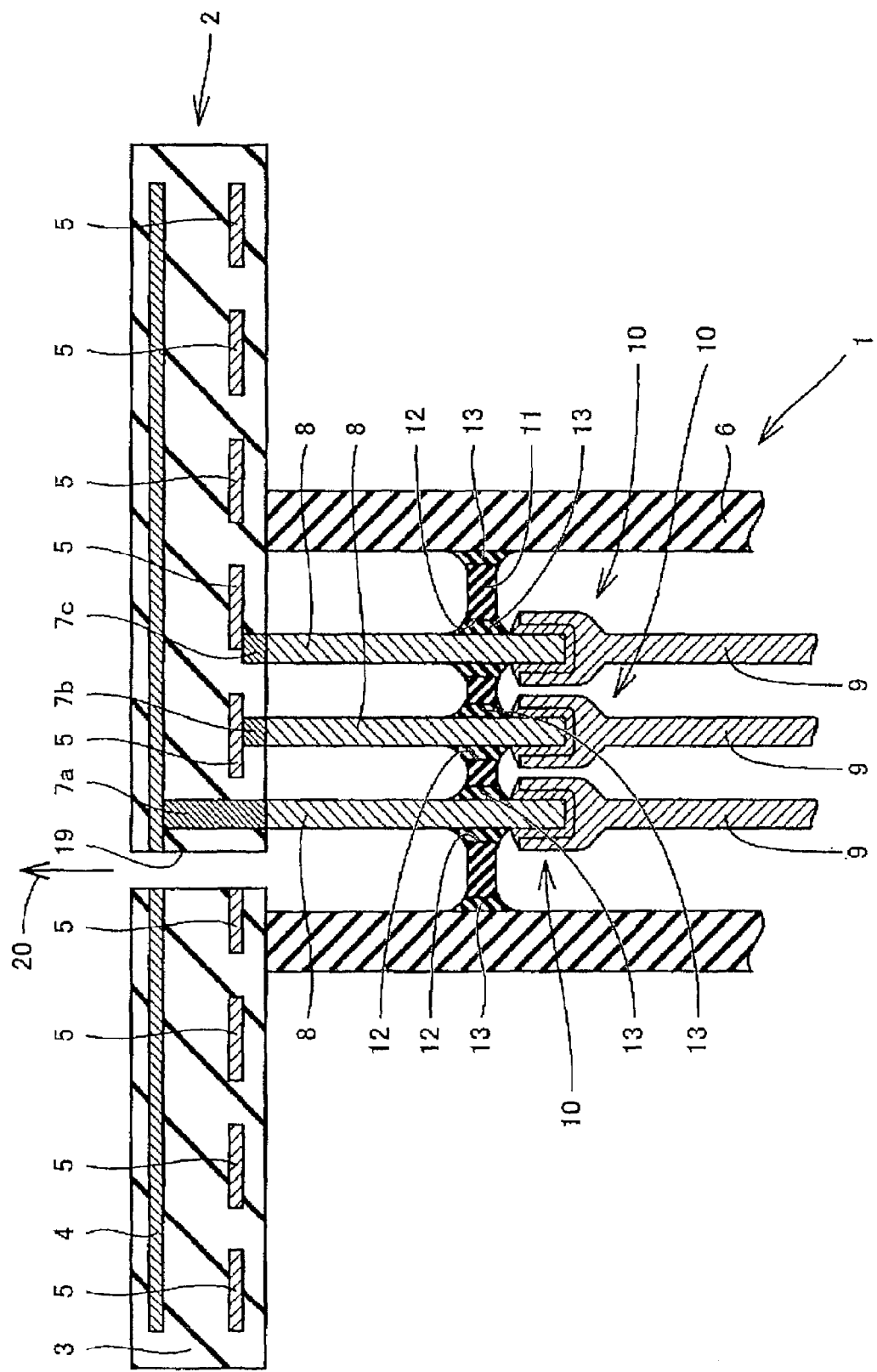
FIG. 12 is a schematic, cross-sectional view of a sample used for determining airtightness.
Figure 13:
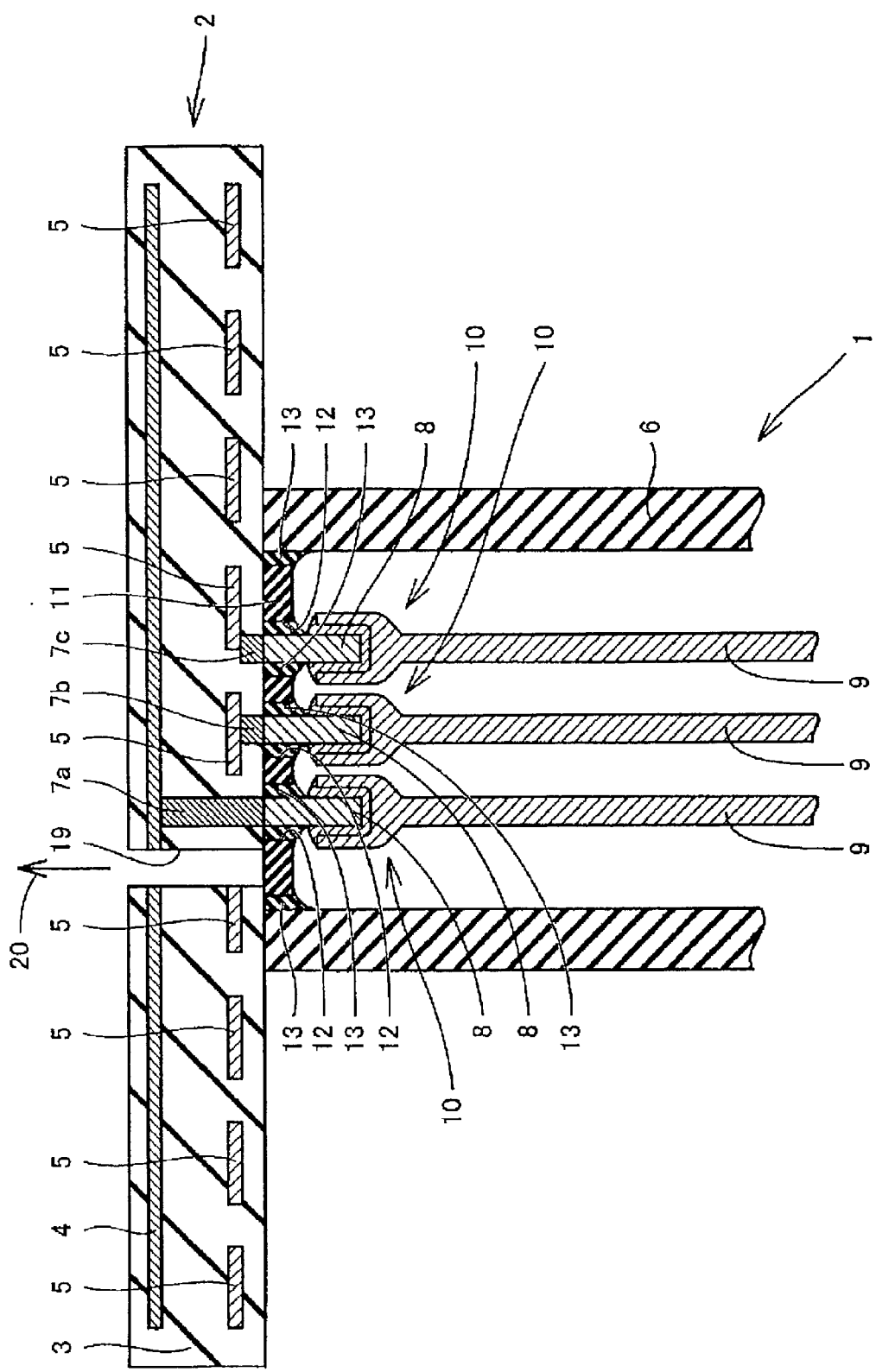
FIG. 13 is a schematic, cross-sectional view of a sample used for determining airtightness.
Figure 14:
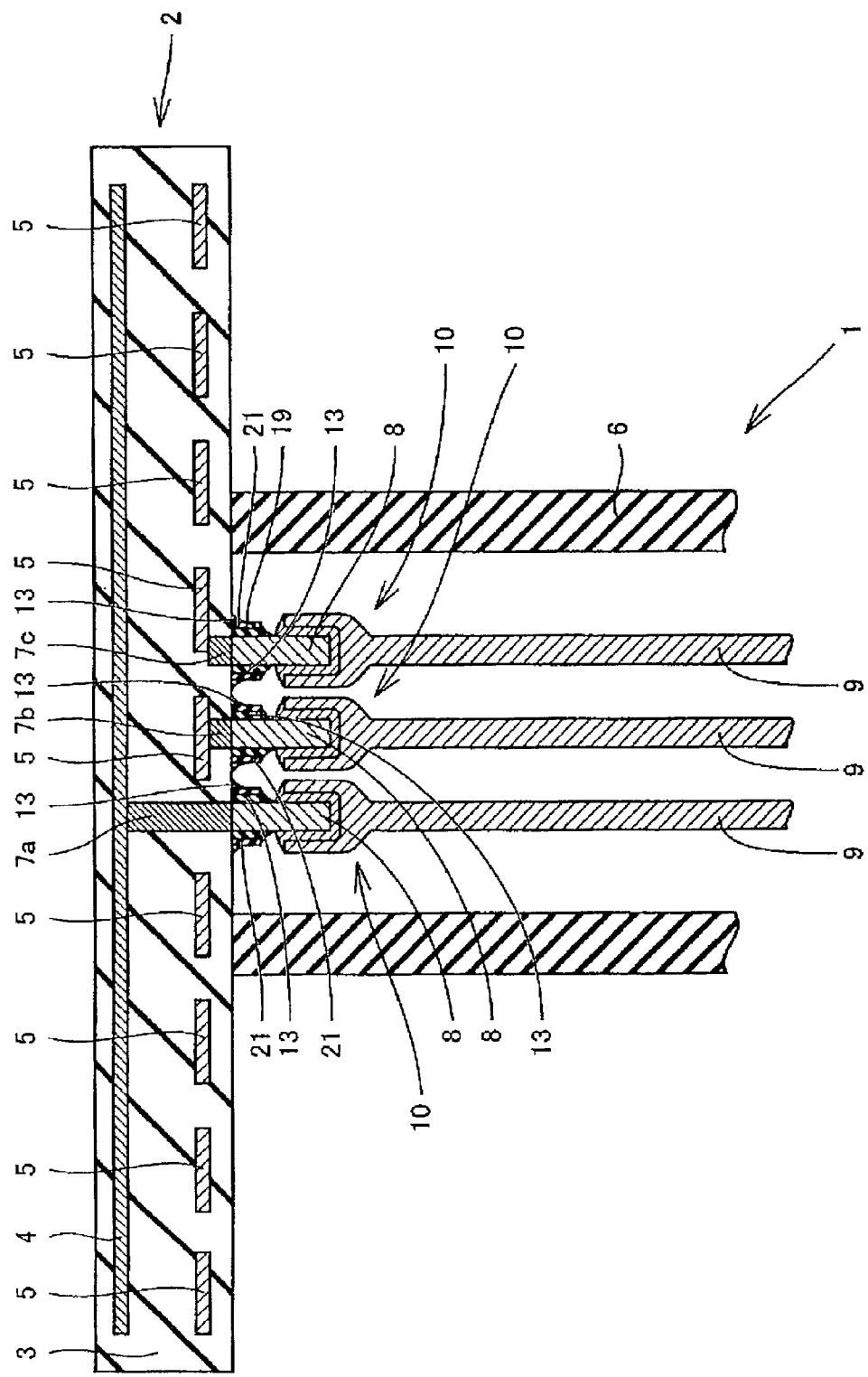
FIG. 14 is a schematic, cross-sectional view of a sample used for determining airtightness.

Next, in order to determine the airtightness of a sealed portion (a region surrounded by the ceramic body, the tubular member, and the sealing member) of each sample, a measuring hole 19, which was a hole penetrating from the surface (on which a wafer is to be mounted) of the ceramic body to the sealed portion, was formed, as shown in FIGS. 12 and 13. For samples having the structure corresponding to that shown in FIGS. 6 and 7 according to the fourth embodiment of the present invention, the measuring hole 19 was formed in the sidewall of the sealing member 21 so as to extend to the inside periphery thereof as shown in FIG. 14. For samples (sample Nos. 69 to 107) having the structure corresponding to that shown in FIG. 8 of the first modified example according to the fourth embodiment of the present invention, in order to determine the airtightness, a measuring hole, which was a hole penetrating from a surface (on which a wafer is mounted) of the ceramic body to a sealed portion, was formed. FIGS. 12 to 14 are schematic, cross-sectional views each showing a sample used for the measurement of the airtight property. The inside of the sealed region (the region surrounded by the tubular member, the sealing member, and the ceramic body) and the sealed portion (the region surrounded by the sealing member and the ceramic body) was evacuated in the direction indicated by an arrow 20 through this measuring hole 19 formed by machining, and subsequently, the leak rate measurement was performed for each sample using a helium detector. The results are shown in Tables II to IX. As can be seen from Tables II to IX, the sealed region of each sample according to the embodiment of the present invention had a sufficient airtight property.

In addition, sealing portions (a bonding portion between the sealing member and the terminal-side electrode line, a bonding portion between the sealing member and the ceramic body) were evaluated with respect to the formation of a meniscus portion between the glass functioning as the bond member and the tubular member, the sealing member, the ceramic body, or the electrode line. The results are shown in Tables II to VI. As can be seen in Tables II to VI, in every holder sample having meniscus portions, the sealed region had a high airtight property.

Concerning sample Nos. 69 to 107, whether a pressure was applied or not during firing treatment (while sealing is performed) is shown in Tables VII to IX. From Tables VII to IX, it was understood that a sample to which a pressure was applied during sealing had a higher airtight property.

Although not shown in Tables II to IX, molybdenum (Mo) or tungsten (W) was used as a material forming the power supply terminals embedded in the ceramic body. When molybdenum (Mo) or tungsten (W) was used as the material for the power supply terminals, there were no recognizable differences in advantage between the materials in particular.

In the column "sealing " in Tables II to VI, "space", "contact", and "individual" are shown. The "space" means the structure in which, as in the case of the first embodiment of the present invention, a space was formed as a sealed region by the sealing member, the tubular member, and the ceramic body, since the sealing member and the ceramic body were disposed apart from each other. The term "contact" means the structure in which, as in the case of the third embodiment of the present invention, the sealing member was in contact with the rear surface of the ceramic body. In addition, "individual" means the structure in which, as in the case of the fourth embodiment of the present invention, individual sealing members were provided for the corresponding connection portions between the electrical circuits and the terminal-side electrode lines. The term "contact with glass (FIG. 8)" means the structure in which, as in the case of the holder shown in FIG. 8, glass was provided only at the ceramic body side of the sealing member.

The column "sealing atmosphere" shows an atmosphere used in a heat treatment that was performed for bonding and fixing the sealing member to the electrode line or the tubular member after application of glass. The material shown in the column "material for electrode line" are materials used for the electrode lines connected to the power supply terminals for the electrical circuits, such as a heater circuit, the electrostatic electrode, and the plasma-forming electrode, which were embedded in the ceramic body.

The embodiments and the examples described above have been disclosed by way of example, and the present invention is not limited thereto. The spirit and the scope of the present invention are disclosed in the claims, and in addition, modification thereof may be optionally made without departing from the spirit and the scope of the present invention.

What is claimed is:

1. A workpiece holder for holding a workpiece comprising:
   a ceramic body which has an electrical circuit and which holds a workpiece;
   a tubular member having an end portion ("first end portion") fixed to the rear surface of the ceramic body;
   a sealing member which is disposed inside the tubular member and bonded thereto and which separates a space inside the tubular member into two regions: a region on the first end portion side ("sealed region") and a region on the opposite side ("opposite region"); and
   power supply conductive members which extends from the opposite side, penetrating the sealing member to the sealed region side, and which are electrically connected to the electrical circuit of the ceramic body.

2. A workpiece holder according to claim 1, wherein the sealing member is disposed at a distance from the rear surface of the ceramic body.

3. A workpiece holder according to claim 1, wherein a region defined by the sealing member, the tubular member, and the ceramic body is vacuum or non-oxidizing atmosphere.

4. A workpiece holder according to claim 1, wherein the rate of helium leak from a region defined by the sealing member, the tubular member, and the ceramic body to other region is $10^{-8}$ Pa·m$^3$/s or less.

5. A workpiece holder according to claim 1, wherein the tubular member and the sealing member are bonded together through a bonding member provided therebetween.

6. A workpiece holder according to claim 5, wherein the bond member is formed by heating a bond material while a pressure of 100 g/cm$^2$ or more is applied thereto through the sealing member side.

7. A workpiece holder according to claim 6, wherein the bond member has a surface extending from a part of the inside surface of the tubular member onto a part of a surface of the sealing member, and the surface of the bond member is a concave meniscus.

8. A workpiece holder according to claim 5, wherein the bond member has a surface extending from a part of the inside surface of the tubular member onto a part of a surface of the sealing member, and the surface of the bond member is a concave meniscus.

9. A workpiece holder according to claim 5, wherein the bond member includes glass.

10. A workpiece holder according to claim 9, wherein the glass is ZnO——SiO$_2$——B$_2$O$_3$-based glass.

11. A workpiece holder according to claim 5, wherein
    the bonding portion between the sealing member and the power supply conductive member include an additional bond member provided between the sealing member and the power supply conductive member,
    the bond member has a surface extending from a part of a surface of the sealing member onto a part of the surface of the power supply conductive member, and
    the surface of the additional bond member is a concave meniscus.

12. A workpiece holder according to claim 1, wherein the sealing member includes a material equivalent to a material forming the tubular member.

13. A workpiece holder according to claim 1, wherein the sealing member includes a material equivalent to a material forming the ceramic body.

14. A workpiece holder according to claim 1, wherein the ceramic body includes aluminum nitride.

15. A workpiece holder according to claim 1, wherein the power supply conductive member includes an iron-nickel-cobalt alloy.

16. A workpiece holder according to claim 1, wherein the power supply conductive member comprises:
    a base material containing at least one selected from the group consisting of tungsten, molybdenum, and an alloy thereof; and
    a coating layer which is provided on the surface of the base material and which contains at least one of nickel and gold.

17. A processing apparatus provided with a workpiece holder according to claim 1.

18. A semiconductor manufacturing apparatus provided with a workpiece holder according to claim 1.

19. A workpiece holder for holding a workpiece, comprising:
    a ceramic body which has an electrical circuit and which holds a workpiece;
    a tubular member having an end portion ("first end portion") fixed to the rear surface of the ceramic body;
    a sealing member which is disposed inside the tubular member and bonded thereto, which is in contact with the rear surface of the ceramic body, and which separates the rear surface of the ceramic body from a region on the opposite side ("opposite region") of the first end portion of the tubular member; and
    power supply conductive members, which are disposed inside the tubular member and extend from the opposite side, penetrating the sealing member toward the first end portion from the opposite region, and which are electrically connected to the electrical circuit of the ceramic body.

20. A workpiece holder for holding a workpiece, comprising:
    a ceramic body which has an electrical circuit and which holds a workpiece;

a tubular member having an end portion ("first end portion") fixed to the rear surface of the ceramic body;

a sealing member which is disposed inside the tubular member and bonded thereto, which is bonded to the rear surface of the ceramic body through a fixing bond member, and which separates the rear surface of the ceramic body from a region on the opposite side ("opposite region") of the first end portion of the tubular member; and power supply conductive members, which are disposed inside the tubular member and extend from the opposite side, penetrating the sealing member toward the first end portion from the opposite region, and which are electrically connected to the electrical circuit of the ceramic body.

21. A workpiece holder according to claim 20, wherein the fixing bond member is formed by heating a fixing bond material while a pressure of 100 g/cm$^2$ or more is applied thereto through the sealing member.

22. A workpiece holder for holding a workpiece comprising:

a ceramic body which has an electrical circuit and which holds the workpiece;

a tubular member having an end portion fixed to the rear surface of the ceramic body;

power supply conductive members electrically connected to the electrical circuit at a connection portion inside the tubular member; and a sealing member which is disposed inside the tubular member and is bonded to the ceramic body at connection portions positioned inside the tubular member.

23. A workpiece holder according to claim 22, wherein the sealed portion of the connection portions in which the supply conductive members and the electrical circuit are connected together is vacuum or non-oxidizing atmosphere.

24. A workpiece holder according to claim 23, wherein the rate of helium leak to other region from the sealed portion of the connection portions in which the supply conductive members and the electrical circuit are connected together is $10^{-8}$ Pa·m$^3$/s or less.

25. A workpiece holder according to claim 22, wherein the tubular member and the sealing member are bonded together through a bonding member provided therebetween.

26. A workpiece holder according to claim 25, wherein the bond member is formed by heating a bond material while a pressure of 100 g/cm$^2$ or more is applied thereto through the sealing member.

27. A workpiece holder according to claim 26, wherein the bond member has a surface extending from a part of the rear surface of the ceramic body onto a part of the surface of the sealing member, and the surface of the bond member is concave meniscus.

28. A workpiece holder according to claim 25 wherein the bond member has a surface extending from a part of the rear surface of the ceramic body onto a part of the surface of the sealing member, and the surface of the bond member is concave meniscus.

29. A workpiece holder according to claim 25, wherein the bond member includes glass.

30. A workpiece holder according to claim 29, wherein the glass is ZnO——SiO$_2$——B$_2$O$_3$-based glass.

31. A workpiece holder according to claim 25, wherein the bonding portion between the sealing member and the power supply conductive member include an additional bond member provided between the sealing member and the power supply conductive member, the bond member has a surface extending from a part of a surface of the sealing member onto a part of the surface of the power supply conductive member, and the surface of the additional bond member is a concave meniscus.

32. A workpiece holder according to claim 22, wherein the sealing member includes a material equivalent to a material forming the tubular member.

33. A workpiece holder according to claim 22, wherein the sealing member includes a material equivalent to a material forming the ceramic body.

34. A workpiece holder according to claim 22, wherein the ceramic body includes aluminum nitride.

35. A workpiece holder according to claim 22, wherein the power supply conductive member includes an iron-nickel-cobalt alloy.

36. A workpiece holder according to claim 22, wherein the power supply conductive member comprises:

a base material containing at least one selected from the group consisting of tungsten, molybdenum, and an alloy thereof; and a coating layer which is provided on the surface of the base material and which contains at least one of nickel and gold.

37. A processing apparatus provided with a workpiece holder according to claim 22.

38. A semiconductor manufacturing apparatus provided with a workpiece holder according to claim 22.

* * * * *